(12) United States Patent
Gardner et al.

(10) Patent No.: US 11,302,587 B2
(45) Date of Patent: Apr. 12, 2022

(54) METHOD FOR FABRICATING A 3D SEMICONDUCTOR APPARATUS HAVING TWO VERTICALLY DISPOSED SEMINCONDUCTOR DEVICES

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/951,125

(22) Filed: Nov. 18, 2020

(65) Prior Publication Data

US 2022/0077003 A1    Mar. 10, 2022

Related U.S. Application Data

(60) Provisional application No. 63/076,734, filed on Sep. 10, 2020.

(51) Int. Cl.
*H01L 21/8238* (2006.01)

(52) U.S. Cl.
CPC ............ *H01L 21/823885* (2013.01); *H01L 21/823807* (2013.01); *H01L 21/823814* (2013.01); *H01L 21/823828* (2013.01); *H01L 21/823857* (2013.01)

(58) Field of Classification Search
CPC ......... H01L 21/8238; H01L 21/823807; H01L 21/823814; H01L 21/823828; H01L 21/823857; H01L 21/823885
See application file for complete search history.

(56) References Cited

U.S. PATENT DOCUMENTS

2017/0133279 A1* 5/2017 Peng ............... H01L 21/823878

* cited by examiner

*Primary Examiner* — Hoai V Pham
(74) *Attorney, Agent, or Firm* — Oblon, McClelland, Maier & Neustadt, L.L.P.

(57) ABSTRACT

Aspects of the present disclosure provide a method for fabricating a 3D semiconductor apparatus. The method can include forming a multilayer stack including a plurality of dielectric layers. The dielectric layers can include three or four dielectric materials that can be etched selectively with respect to one another. The method can also include forming opening(s) in the multilayer stack, and filling the opening(s) with first and second channel materials to form first and second channels that interface at a transition dielectric layer the multilayer stack. The method can also include removing second and first source/drain (S/D) dielectric layers of the multilayer stack and replacing with second and first S/D materials to form second and first S/D regions, respectively. The method can also include removing gate dielectric layers of the multilayer stack and replacing with a gate material to form gate regions of the 3D semiconductor apparatus.

20 Claims, 17 Drawing Sheets

METHOD FOR FABRICATING A 3D SEMICONDUCTOR APPARATUS HAVING TWO VERTICALLY DISPOSED SEMINCONDUCTOR DEVICES

INCORPORATION BY REFERENCE

This present disclosure claims the benefit of U.S. Provisional Application No. 63/076,734, "Advanced 3D Technology Architecture Layout using 3D Compact Device Designs" filed on Sep. 10, 2020, which is incorporated herein by reference in its entirety.

FIELD OF THE INVENTION

The present disclosure relates to semiconductor fabrication, and, more particularly, to methods of forming compact semiconductor device designs for 3D fabrication.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration is seen as a viable option to continue semiconductor scaling. As the contacted gate pitch reaches its scaling limit due to manufacturing variability and electrostatic device limitations, 2D transistor density scaling stops.

SUMMARY 3D integration, i.e., the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies. One such technology can take advantage of thermal bonding of separate nanoplane dielectric layer stacks on separate substrates to form a combined dielectric layer stack and increase resulting transistor density.

Aspects of the present disclosure provide a method for fabricating a 3D semiconductor apparatus. In an embodiment, the 3D semiconductor apparatus can include a first semiconductor device and a second semiconductor device. For example, the method can include forming a multilayer stack on a substrate, the multilayer stack including gate dielectric layers, a transition dielectric layer that is capable of being etched selectively with respect to the gate dielectric layers, and first and second source/drain (S/D) dielectric layers that are capable of being etched selectively with respect to the gate dielectric layers and the transition dielectric layer. The method can also include forming at least one opening through the multilayer stack to the substrate such that the substrate is uncovered. The method can also include forming in the opening a first channel of a first semiconductor device of the semiconductor apparatus vertically from the uncovered substrate and a second channel of a second semiconductor device of the semiconductor apparatus vertically from the first channel, the first channel interfacing with the second channel at the transition dielectric layer of the multilayer stack. The method can also include etching the second S/D dielectric layers of the multilayer stack and replacing with a second S/D material to form second S/D regions of the second semiconductor device of the semiconductor apparatus. The method can also include etching the first S/D dielectric layers of the multilayer stack and replacing with a first S/D material to form first S/D regions of the first semiconductor device of the semiconductor apparatus. The method can also include etching the gate dielectric layers of the multilayer stack and replacing with a gate material to form a first gate region of the first semiconductor device of the semiconductor apparatus and a second gate region of the second semiconductor device of the semiconductor apparatus. For example, the first and second semiconductor devices are of different types.

In an embodiment, the multilayer stack can further include separation dielectric layers that separate the gate dielectric layers from the S/D dielectric layers and are capable of being etched selectively with respect to the gate dielectric layers and the S/D dielectric layers. In another embodiment, the method can further include removing the transition dielectric layer to uncover a portion of the first channel and the second channel that interface at the transition dielectric layer, oxidizing the uncovered portion of the first channel and the second channel to form an isolation region, and covering the isolation region with a dielectric material that is capable of being etched selectively with respect to the gate dielectric layers and the first and second S/D dielectric layers. For example, the transition dielectric layer can include a same dielectric material as the dielectric material.

In an embodiment, the gate material can include a dielectric material and a metal material. In another embodiment, the method can further include coupling the metal material of the first gate region of the first semiconductor device to the metal material of the second gate region of the second semiconductor device.

In an embodiment, forming at least one opening can include forming two openings through the multilayer stack to the substrate such that the substrate is exposed. For example, the two openings can have different sizes. In another embodiment, the method can further include etching the multilayer stack to define sidewall structures of the multilayer stack that are around the first and second channels, wherein etching the second S/D dielectric layers of the multilayer stack includes etching second S/D dielectric layers of the sidewall structures of the multilayer stack, etching the first S/D dielectric layers of the multilayer stack includes etching first S/D dielectric layers of the sidewall structures of the multilayer stack, and etching the gate dielectric layers of the multilayer stack includes etching gate dielectric layers of the sidewall structures of the multilayer stack.

In an embodiment, the method can further include forming a pre-metal dielectric (PMD) oxide to cover the first semiconductor device before the gate regions and the first and second S/D regions are formed, and removing the PDM oxide to uncover the first dielectric layer stack after the second S/D regions are formed. For example, removing second source/drain (S/D) dielectric layers of the layers of the multilayer stack and replacing with a second material can include etching the second S/D dielectric layers, forming the second S/D material, and forming a second capping dielectric layer to protect the second S/D material. As another example, removing first source/drain (S/D) dielectric layers of the layers of the multilayer stack and replacing with a first material can include etching the first S/D dielectric layers, forming the first S/D material, and forming a first capping dielectric layer to protect the first S/D material, wherein the first S/D material is of a different type from the second S/D material. In an embodiment, the method can further include removing the first and second capping dielectric layers, depositing salicide metal on the first and second S/D materials, and silicidizing the salicide metal with the first and second S/D materials. For example, the salicide metal can be selected from the group consisting of Ruthenium (Ru), Cobalt (Co), Titanium (Ti), Tungsten (W), Palladium (Pd), Platinum (Pt) and Nickel (Ni). In another embodiment, the method can further include coupling the silicidized salicide metal of a lower one of the second S/D regions of the second semiconductor device to the silicidized salicide metal of an upper one of the first S/D regions of the first semiconductor device.

In an embodiment, the substrate can be a semiconductor substrate. In an embodiment, the first and second channels can be formed by epitaxially growing, within the opening, a first channel material from the substrate to the transition dielectric layer to form the first channel, and epitaxially growing, within the opening, a second channel material from the transition dielectric layer to top of the multilayer stack to form the second channel. For example, epitaxially growing the first channel material can include epitaxially growing an intrinsic channel material and doping a first type of dopants into the intrinsic channel material, and epitaxially growing the second channel material can include epitaxially growing the intrinsic channel material and doping a second type of dopants into the intrinsic channel material.

In an embodiment, the first S/D dielectric layers can be etched selectively with respect to the second S/D dielectric layers.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
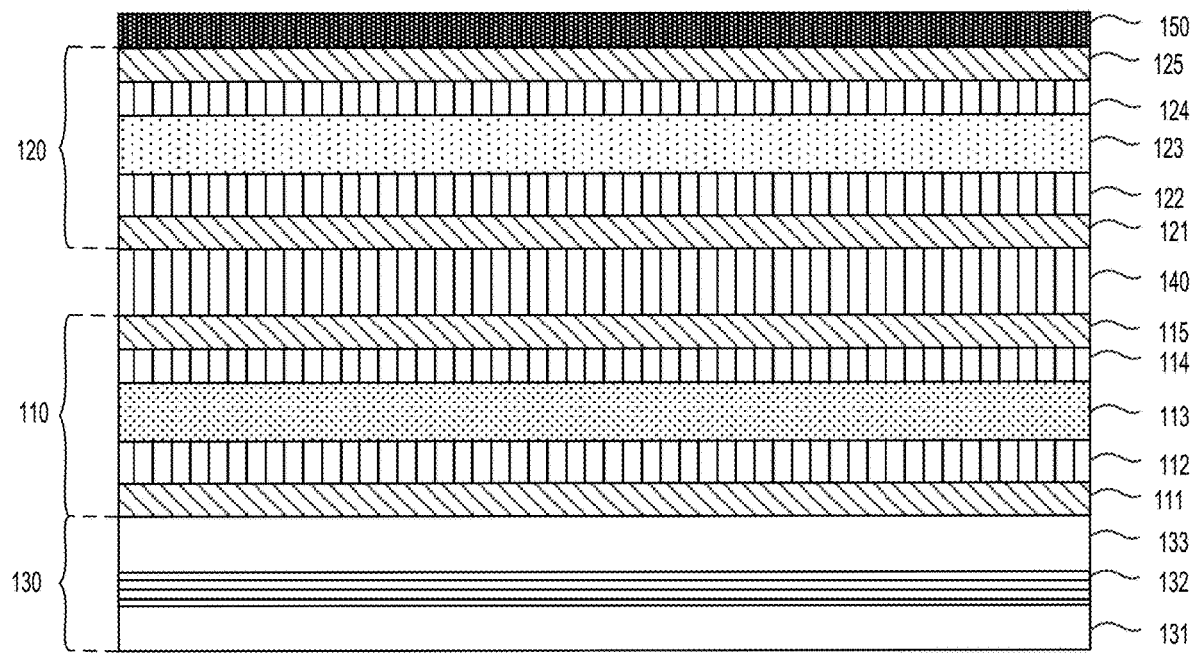
FIGS. 1-12, 13A and 14 show cross-sectional views illustrating an exemplary method for fabricating a 3D semiconductor apparatus according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein can include methods of forming compact device designs for 3D fabrication. Techniques can include vertical channel devices. The vertical channel devices can have a channel length defined by epitaxially growth. Techniques and designs herein can enhance density of transistors on a substrate. Embodiments can include NMOS and PMOS stacked vertical nanosheet with isolation between the NMOS and PMOS to enable multiple 3D logic elements. Techniques herein can also enable vertical isolation of 3D semiconductor devices in selective regions for optimum 3D logic layout in other processes. Embodiments can include selectively growing source/drain (S/D) regions in a direction perpendicular to a channel flow, which enables a 360 degree connection and robust S/D surface area for high performance devices.

Embodiments herein can include an NMOS and PMOS stacked vertical nanosheet with the devices connected in-situ to form a 3D inverter with in-situ epi growth of the 3D transistor stack. In an embodiment, upright complete NMOS transistor and PMOS transistor are epitaxially grown with separate control of channel doping.

Embodiments herein can provide methods for forming 3D semiconductor apparatuses. FIGS. 1-12, 13A and 14 show cross-sectional views illustrating an exemplary method for fabricating a 3D semiconductor apparatus according to some embodiments of the present disclosure. FIG. 13B shows a schematic view of the 3D semiconductor apparatus of FIG. 13A. For example, the 3D semiconductor apparatus can include a first semiconductor device and a second semiconductor device. In an embodiment, the method can include forming a multilayer stack on a substrate, the multilayer stack including gate dielectric layers, a transition dielectric layer that is capable of being etched selectively with respect to the gate dielectric layers, and first and second source/drain (S/D) dielectric layers that are capable of being etched selectively with respect to the gate dielectric layers and the transition dielectric layer. The method can also include forming at least one opening through the multilayer stack to the substrate such that the substrate is uncovered. The method can also include forming in the opening a first channel of a first semiconductor device of the semiconductor apparatus vertically from the uncovered substrate and a second channel of a second semiconductor device of the semiconductor apparatus vertically from the first channel, the first channel interfacing with the second channel at the transition dielectric layer of the multilayer stack. The method can also include etching the second S/D dielectric layers of the multilayer stack and replacing with a second S/D material to form second S/D regions of the second semiconductor device. The method can also include etching the first S/D dielectric layers of the multilayer stack and replacing with a first S/D material to form first S/D regions of the first semiconductor device. The method can also include etching the gate dielectric layers the multilayer stack and replacing with a gate material to form a first gate region of the first semiconductor device and a second gate region of the second semiconductor device.

As shown in FIG. 1, a substrate 130 can be provided. In an embodiment, the substrate 130 can be a silicon on insulator (SOI) substrate. For example, the substrate 130 can include a first semiconductor dielectric layer 131, an oxide dielectric layer 132 formed on the first semiconductor dielectric layer 131, and a second semiconductor dielectric layer 133 form on the oxide dielectric layer 132. In another embodiment, at least one of the first semiconductor dielectric layer 131 and the second semiconductor dielectric layer 133 can include single-crystal silicon or other desired semiconductor materials, such as Ge and SiGe. For example, the substrate 130 can be a silicon/oxide/Ge substrate or a silicon/oxide/SiGe substrate. In yet another embodiment, the oxide dielectric layer 132 can be deposited on the first semiconductor dielectric layer 131, the second semiconductor dielectric layer 133 can then be deposited on the oxide dielectric layer 132, and then an anneal process can be performed, to form the substrate 130.

As also shown in FIG. 1, a first dielectric layer stack 110 can be formed on the substrate 130. In an embodiment, the first dielectric layer stack 110 can include a lower source/drain (S/D) dielectric layer 111, a lower separation dielectric layer 112 formed (e.g., deposited) on the lower S/D dielectric layer 111, a gate dielectric layer 113 formed (e.g., deposited) on the lower separation dielectric layer 112, an upper separation dielectric layer 114 formed (e.g., deposited) on the gate dielectric layer 113, and an upper S/D dielectric layer 115 formed (e.g., deposited) on the upper separation dielectric layer 114. In an embodiment, the dielectric layers 111-115 can be nanosheets. For example, the dielectric layers 111-115 can include oxide bases SiOx, SiOxNy based, high-k based, and high-k OxNy based dielectric materials. In an embodiment, the lower S/D dielectric layer 111 and the upper S/D dielectric layer 115 can include the same dielectric material, e.g., a first dielectric material. In another embodiment, the gate dielectric layer 113 can include a second dielectric material that is capable of being etched selectively with respect to the first dielectric material. In yet another embodiment, the lower separation dielectric layer 112 and the upper separation dielectric layer 114 can include a third dielectric material that is capable of being etched selectively with respect to the first and second dielectric materials. In still another embodiment, the lower separation dielectric layer 112 and the upper separation dielectric layer 114 can have different dielectric materials, both of which are capable of being etched selectively with respect to the first and second dielectric materials.

As also shown in FIG. 1, a transition dielectric layer 140 can be formed (e.g., deposited) on the first dielectric layer stack 110. In an embodiment, the transition dielectric layer 140 can include the third dielectric material and be capable of being etched selectively with respect to the lower S/D dielectric layer 111 and the upper S/D dielectric layer 115, which include the first dielectric material, and to the gate dielectric layer 113, which includes the second dielectric material.

As also shown in FIG. 1, a second dielectric layer stack 120 can be formed on the transition dielectric layer 140. In an embodiment, the second dielectric layer stack 120 can include a lower S/D dielectric layer 121, a lower separation dielectric layer 122 formed (e.g., deposited) on the lower S/D dielectric layer 121, a gate dielectric layer 123 formed (e.g., deposited) on the lower separation dielectric layer 122, an upper separation dielectric layer 124 formed (e.g., deposited) on the gate dielectric layer 123, and an upper S/D dielectric layer 125 formed (e.g., deposited) on the upper separation dielectric layer 124. In an embodiment, the dielectric layers 121-125 can be nanosheets. For example, the dielectric layers 121-125 can include oxide bases SiOx, SiOxNy based, high-k based, and high-k OxNy based dielectric materials. In an embodiment, the lower S/D dielectric layer 121 and the upper S/D dielectric layer 125 can include the same dielectric material, e.g., the first dielectric material. In another embodiment, the gate dielectric layer 123 can include the second dielectric material, which is capable of being etched selectively with respect to the first dielectric material. In yet another embodiment, the lower separation dielectric layer 122 and the upper separation dielectric layer 124 can include the third dielectric material, which is capable of being etched selectively with respect to the first and second dielectric materials. In still another embodiment, the lower separation dielectric layer 122 and the upper separation dielectric layer 124 can include different dielectric materials, both of which are capable of being etched selectively with respect to the first and second dielectric materials. In an embodiment, the first dielectric layer stack 110, the transition dielectric layer 140 and the second dielectric layer stack 120 can be included in a multilayer stack.

As also shown in FIG. 1, a hardmask 150 can be formed on the second dielectric layer stack 120. In an embodiment, the hardmask 150 can be patterned by photolithograph, and then formed on the second dielectric layer stack 120.

Figure 2:
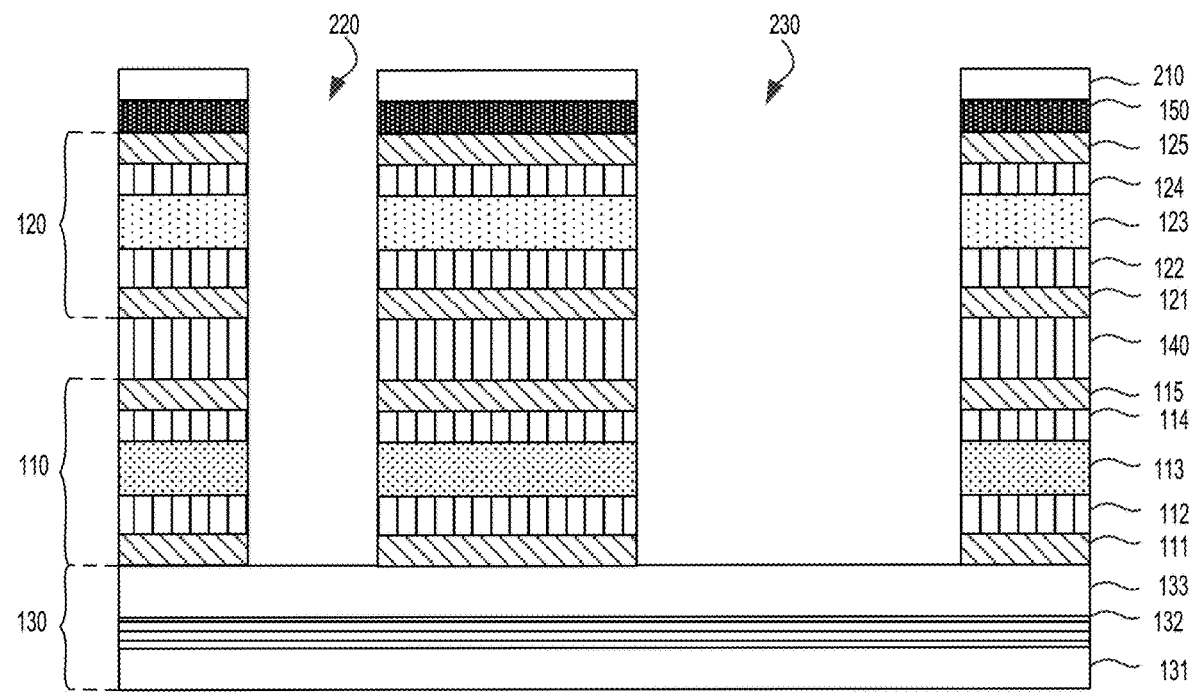

As shown in FIG. 2, a photoresist mask 210 can be patterned and formed on the hardmask 150, and the second dielectric layer stack 120, the transition dielectric layer 140 and the first dielectric layer stack 110 can be etched down to the substrate 130 to form at least one opening. In an embodiment, two openings 220 and 230 are formed. For example, the two openings 220 and 230 can have the same size. As another example, the two openings 220 and 230 can have different sizes.

Figure 3:
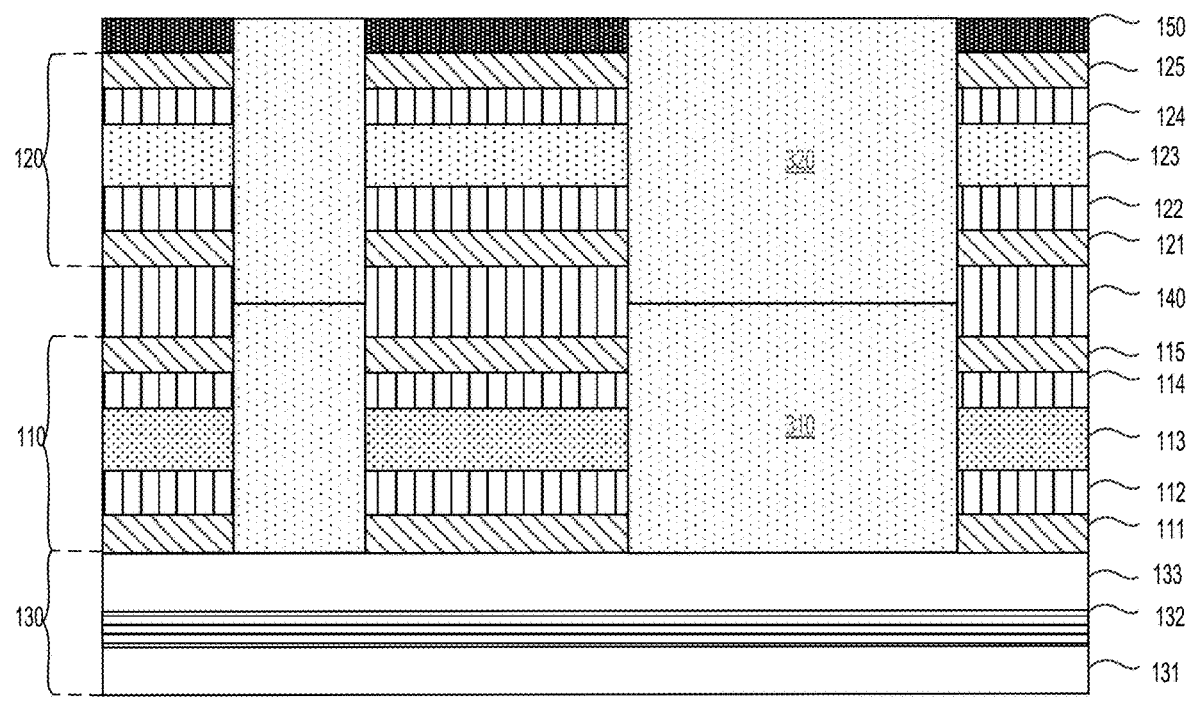

As shown in FIG. 3, the photoresist mask 210 can be removed, the substrate 130 can be cleaned, and an intrinsic channel material can be epitaxially grown from the substrate 130 to the top of the second dielectric layer stack 120. In an embodiment, a first channel material can be epitaxially grown from the substrate 130 to the transition dielectric layer 140, and a first type of dopants can be doped into the first channel material to form a first channel 310. In another embodiment, a second channel material can be epitaxially grown from the transition dielectric layer 140 to the top of the second dielectric layer stack 120, and a second type of dopants can be doped into the second channel material to form a second channel 320. For example, the first type can be N-type, and the second type can be P-type. As another example, the first type can be P-type, and the second type can be N-type. In yet another embodiment, any number of transistor dopings can be defined to meet circuit requirement. In still another embodiment, any type of the epitaxial semiconductor channel can be claimed for the vertical epitaxial growth.

Figure 4:
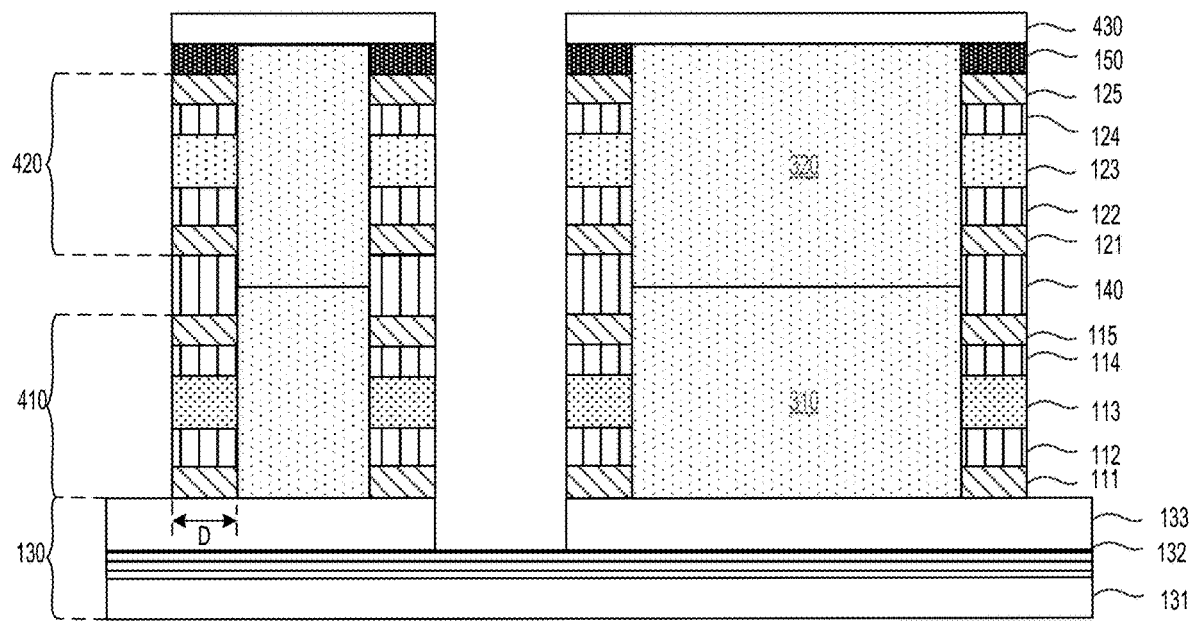

As shown in FIG. 4, a photoresist mask 430 can be patterned to mask the second dielectric layer stack 120, and the second dielectric layer stack 120, the transition dielectric layer 140 and the first dielectric layer stack 110 can be etched a short distance d from the vertically grown epi nano channel stack 310/320, to form a future first semiconductor device 410 and a future second semiconductor device 420 stacked in-situ on the first semiconductor device 410. For example, the first semiconductor device 410 can be an NMOS, the second semiconductor device 420 can be a PMOS, and the NMOS 410 and the PMOS 420 can be coupled to each other to form a CMOS inverter. As another example, the first semiconductor device 410 can be a PMOS, the second semiconductor device 420 can be an NMOS, and the PMOS 410 and the NMOS 420 can be coupled to each other to form another CMOS inverter. In an embodiment, the first semiconductor device 410 and the second semiconductor device 420 can be ring-shaped and surround the vertical channel stack 310/320.

Figure 5:
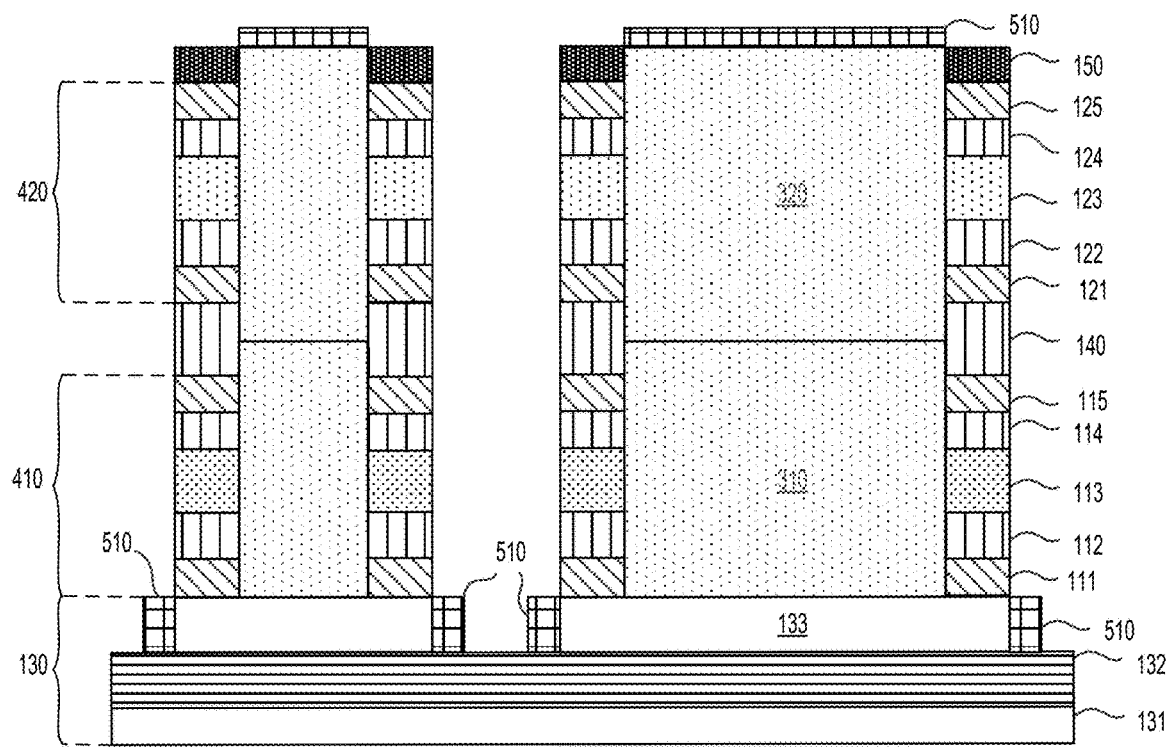

As shown in FIG. 5, the photoresist mask 430 can be removed, and a dielectric material 510 can be optionally deposited or grown on the second channel 320 and the substrate 130.

Figure 6:
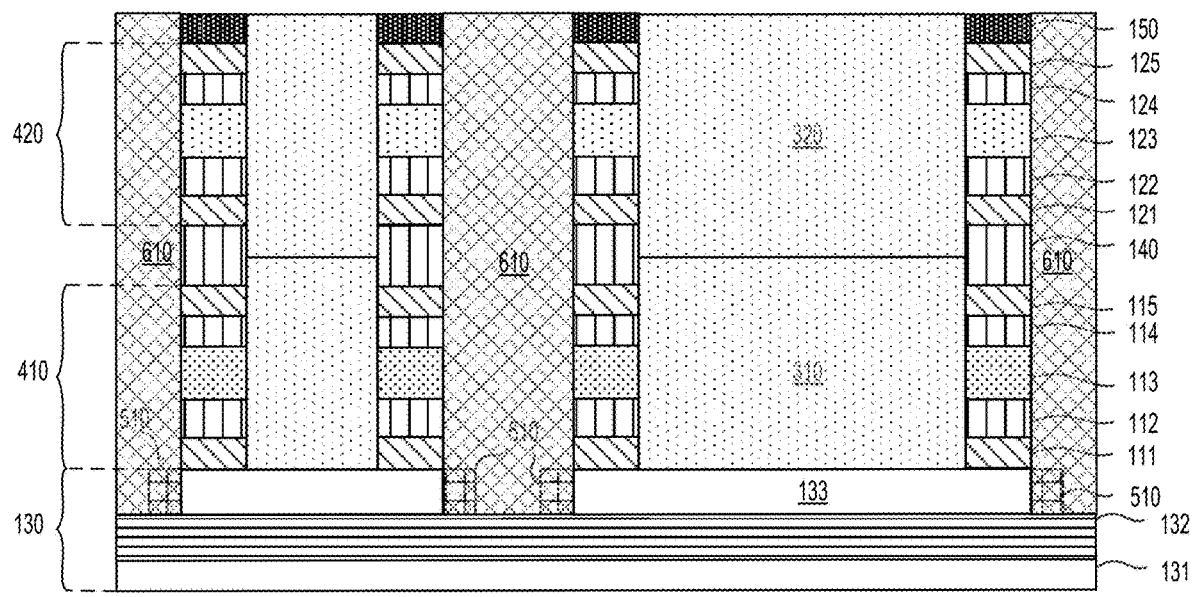

As shown in FIG. 6, a pre-metal dielectric (PMD) oxide 610 or other selective material can be deposited on the substrate 130 to fill the openings formed by etching the second dielectric layer stack 120, the transition dielectric layer 140 and the first dielectric layer stack 110 in FIGS. 4 and 5, and the overburden can be planarized by chemical mechanical polish (CMP) down to the hardmask 150.

Figure 7:
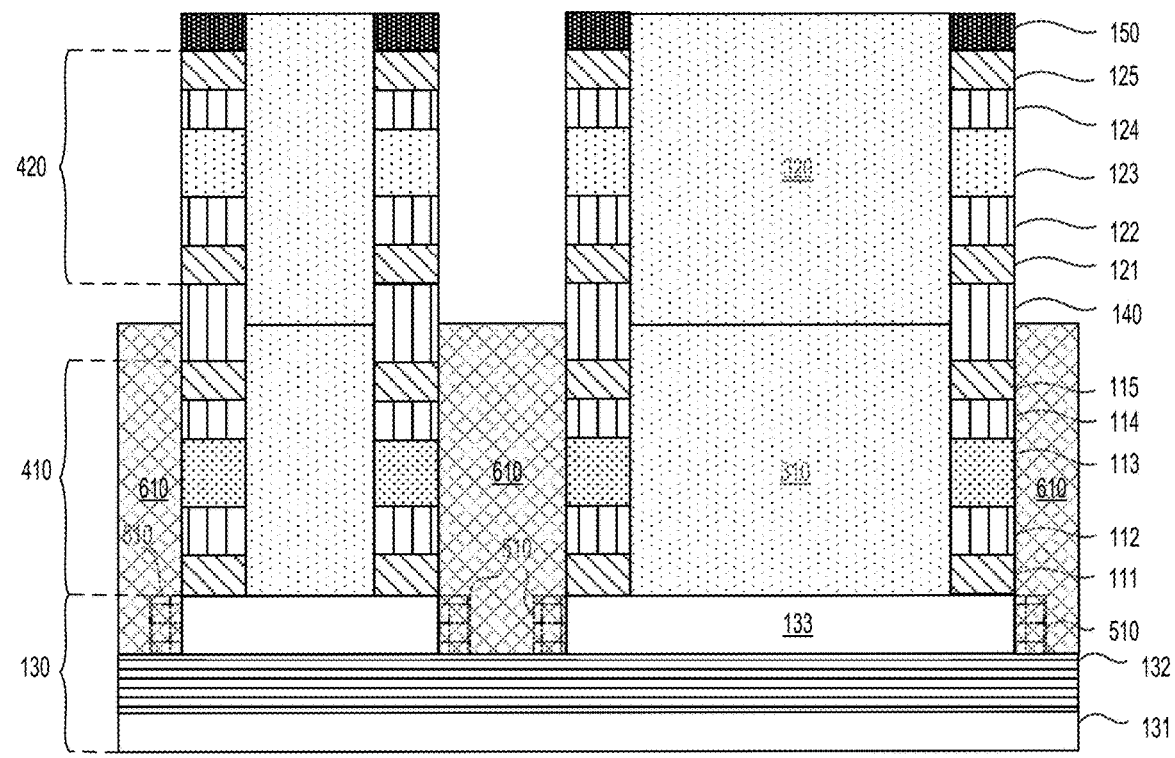

As shown in FIG. 7, the PMD oxide 610 can be etched approximately to a center of the transition dielectric layer 140, e.g., where the first channel 310 interfaces with the second channel 320, to uncover the lower S/D dielectric layer 121 and the upper S/D dielectric layer 125 of the second dielectric layer stack 120.

Figure 8:
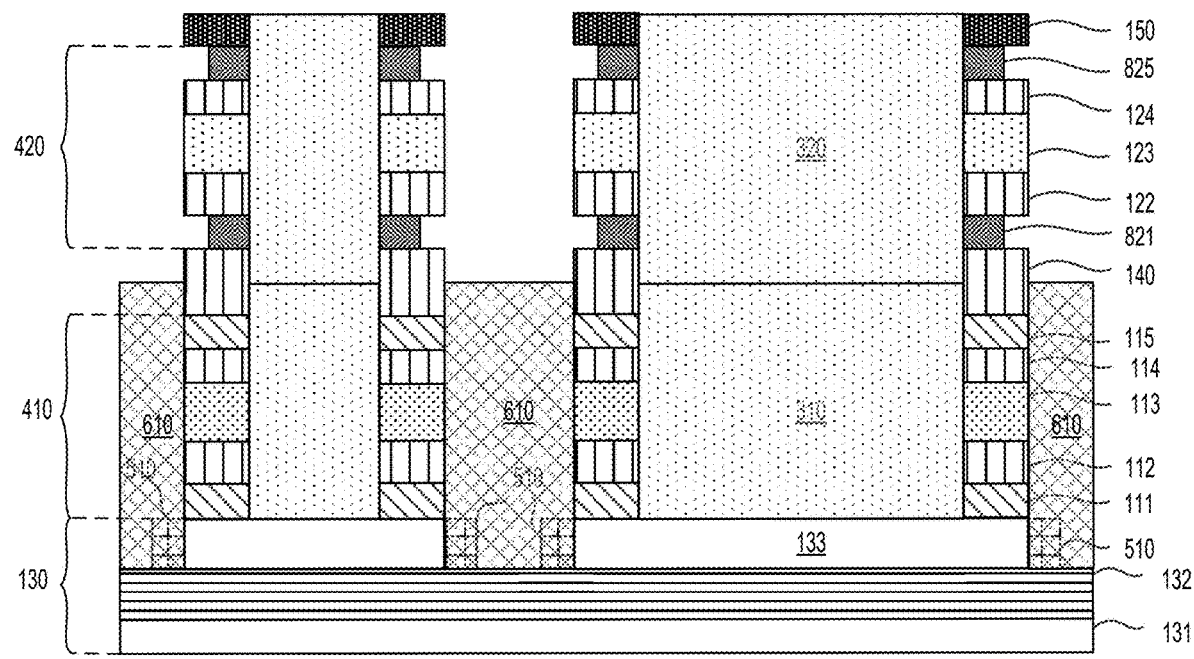

As shown in FIG. 8, the lower S/D dielectric layer 121 and the upper S/D dielectric layer 125 can be etched and removed, and a second S/D material, e.g., SiGe heavily doped boron, can be epitaxially grown to form a lower S/D region 821 and an upper S/D region 825, respectively. For example, the lower S/D dielectric layer 121 and the upper S/D dielectric layer 125 can be etched in a wet etching process. As another example, the lower S/D dielectric layer 121 and the upper S/D dielectric layer 125 can be etched in a dry etching process. As the lower S/D dielectric layer 121 and the upper S/D dielectric layer 125 are capable of being etched selectively with respect to the gate dielectric layer 123, the separation dielectric layers 122 and 124 and the transition dielectric layer 140, when the lower S/D dielectric layer 121 and the upper S/D dielectric layer 125 are etched with one or more etchants in one or more etching conditions, the gate dielectric layer 123, the separation dielectric layers 122 and 124 and the transition dielectric layer 140 will not be etched or substantially etched.

Figure 9:
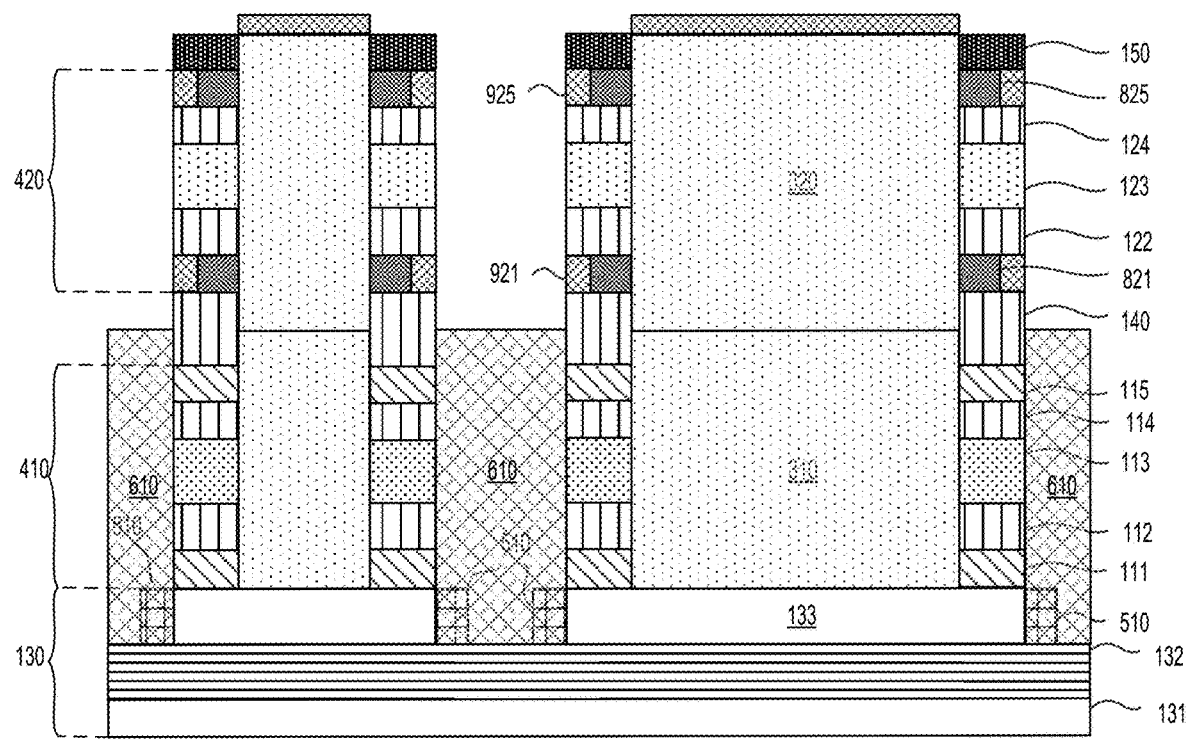

As shown in FIG. 9, a lower capping dielectric layer 931 and an upper capping dielectric layer 935 can be deposited to protect the lower S/D region 821 and the upper S/D region 825, respectively, for future processing steps. For example, the capping dielectric layers 931 and 935 can include TiN.

Figure 10:
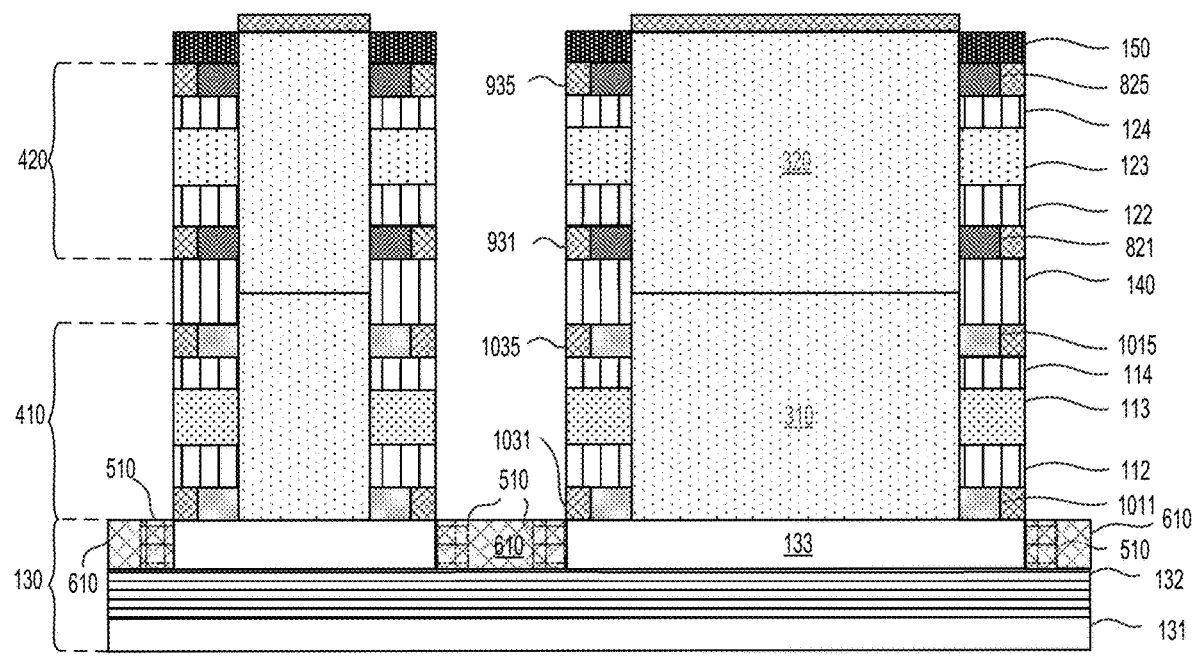

As shown in FIG. 10, the PMD oxide 610 can be further removed to uncover the lower S/D dielectric layer 111 and the upper S/D dielectric layer 115 of the first dielectric layer stack 110, the lower S/D dielectric layer 111 and the upper S/D dielectric layer 115 can then be etched and removed, and a first S/D material (e.g., dopant atoms can be As or P) can be epitaxially grown to form a lower S/D region 1011 and an upper S/D region 1015, respectively. For example, the lower S/D dielectric layer 111 and the upper S/D dielectric layer 115 can be etched in a wet etching process. As another example, the lower S/D dielectric layer 111 and the upper S/D dielectric layer 115 can be etched in a dry etching process. As the lower S/D dielectric layer 111 and the upper S/D dielectric layer 115 are capable of being etched selectively with respect to the gate dielectric layer 113, the separation dielectric layers 112 and 114 and the transition dielectric layer 140, when the lower S/D dielectric layer 111 and the upper S/D dielectric layer 115 are etched with one or more etchants in one or more etching conditions, the gate dielectric layer 113, the separation dielectric layers 112 and 114 and the transition dielectric layer 140 will not be etched or substantially etched. As also shown in FIG. 10, a lower capping dielectric layer 1031 and an upper capping dielectric layer 1035 can be deposited to protect the lower S/D region 1011 and the upper S/D region 1015, respectively, for future processing steps. For example, the capping dielectric layers 1031 and 1035 can include TiN. In an embodiment, the excess TiN can be etched such that the capping dielectric layers 931, 935, 1031 and 1035 can be aligned to the edge of the hardmask 150.

In an embodiment, the lower S/D dielectric layer 111 and the upper S/D dielectric layer 115 can include a dielectric material that is capable of being etched selectively with respect to the gate dielectric layers 113 and 123, which include the second dielectric material, to the separation dielectric layers 112, 114, 122 and 124 and the transition dielectric layer 140, which include the third dielectric material, and to the lower S/D dielectric layer 121 and the upper S/D dielectric layer 125, which include the first dielectric material. In such a scenario, when the lower S/D dielectric layer 121 and the upper S/D dielectric layer 125 are etched in FIG. 8, the lower S/D dielectric layer 111 and the upper S/D dielectric layer 115 will not be etched or substantially etched, and the steps of forming and removing the PMD oxide 610 can be omitted.

Figure 11:
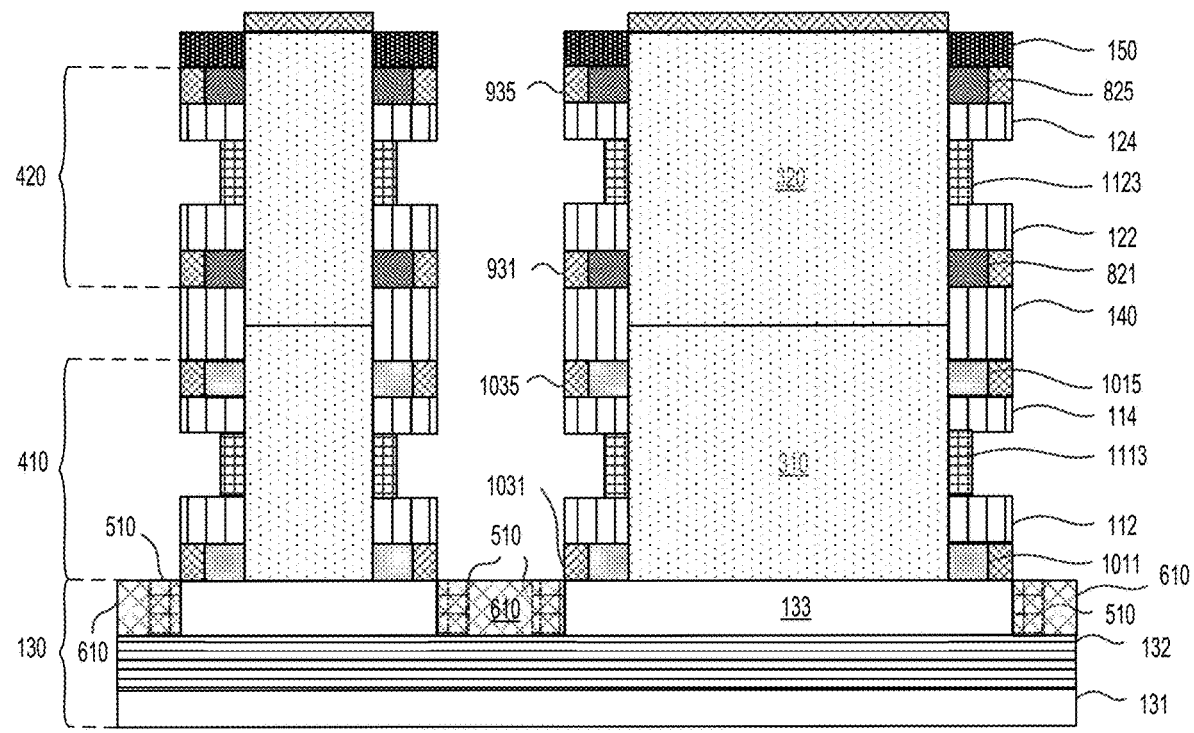

As shown in FIG. 11, the gate dielectric layers 113 and 123 can be etched and removed. For example, the gate dielectric layers 113 and 123 can be etched by isotropic etching such as vapor-phase etching. As also shown in FIG. 11, the gate dielectric layers 113 and 123 can be replaced with a gate material to form a first gate region 1113 and a second gate region 1123, respectively. In an embodiment, the gate material can be a high-k dielectric material. As the gate dielectric layers 113 and 123 are capable of being etched selectively with respect to the separation layers 112, 114, 122 and 124 and the transition layer 140, and the S/D regions 821, 825, 1011 and 1015 are protected by the capping dielectric layers 931, 935, 1031 and 1035, respectively, when the gate dielectric layers 113 and 123 are etched, the separation layers 112, 114, 122 and 124, the transition layer 140, and the S/D regions 821, 825, 1011 and 1015 will not be etched or substantially etched.

Figure 12:
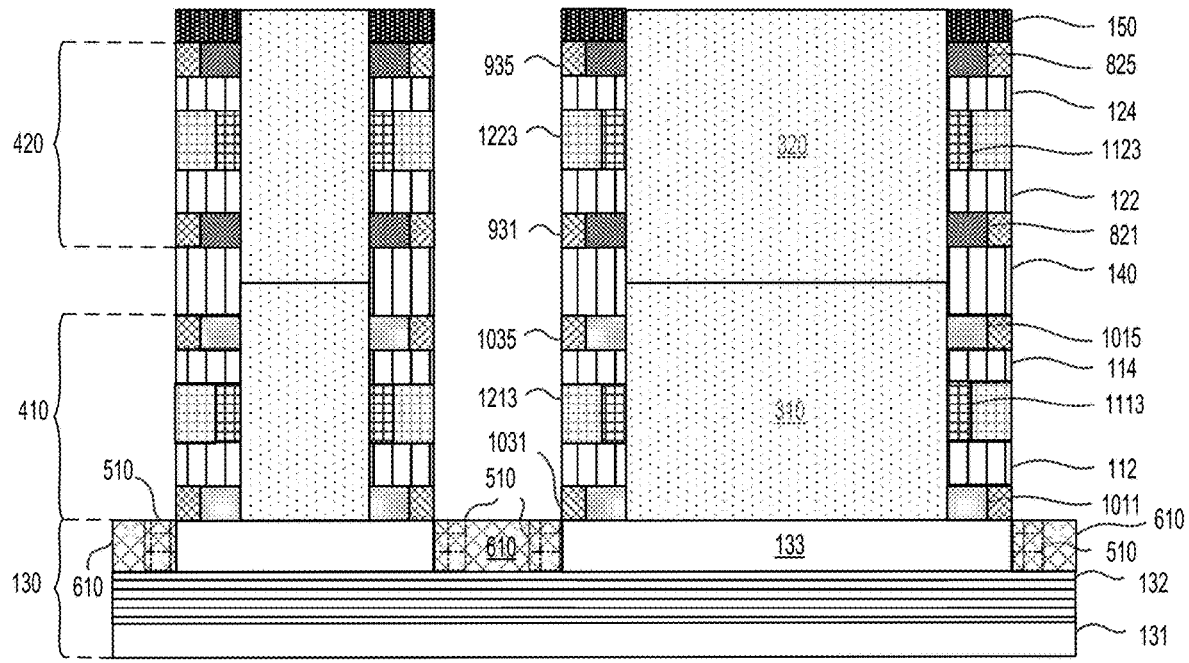

As shown in FIG. 12, a metal material can be deposited on the gate material of the first gate region 1113 and 1123 to form a first metal region 1213 of the first gate region 1113 and a second metal region 1223 of the second gate region 1123, respectively, and the excess metal material can be etched such that the first metal region 1213 and the second metal region 1223 can be aligned to the edge of the hardmask 150. In an embodiment, the metal material can include two or more dielectric layered metal. In an embodiment, an additional dielectric material can be deposited and a CMP process can be performed thereafter, to uncover the gate electrode of the second semiconductor device 420. In another embodiment, the current metal dielectric layer can be removed or an additional metal dielectric layer can be added. This can enable a differential metal work function between the first semiconductor device 410 and the second semiconductor 420 if needed for certain circuit requirements.

Figure 13A:
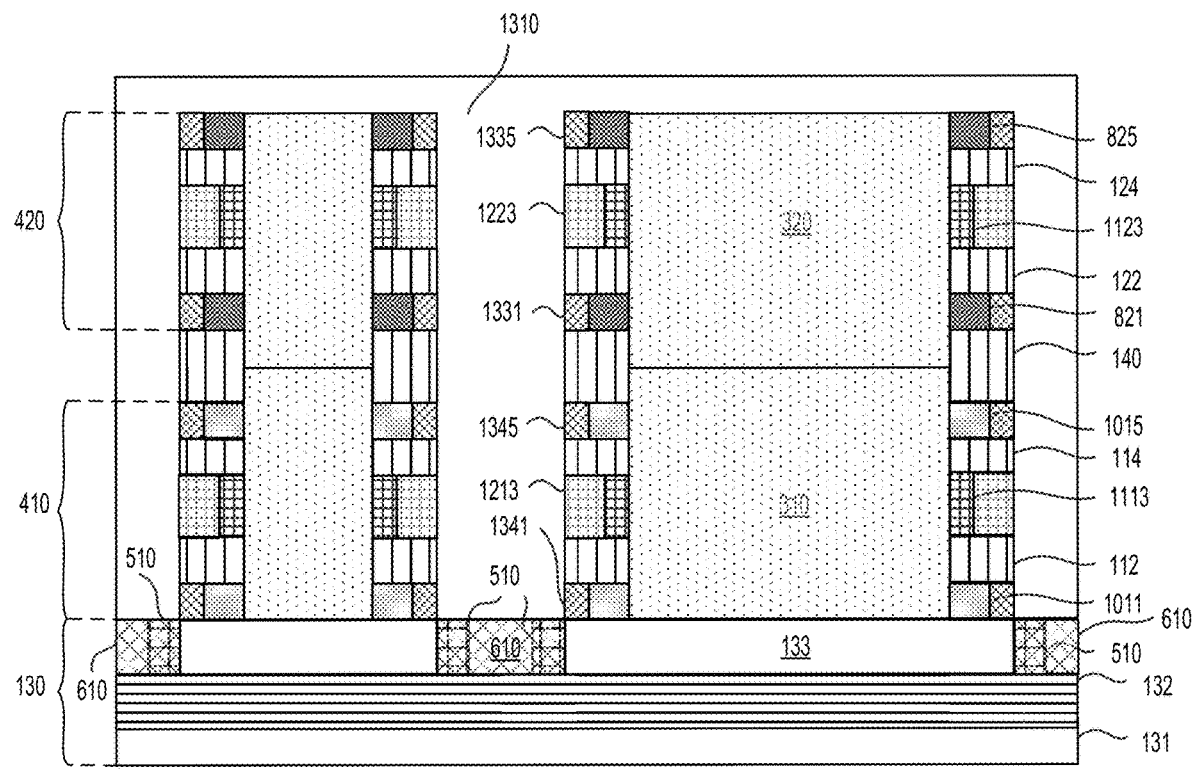
Figure 13B:
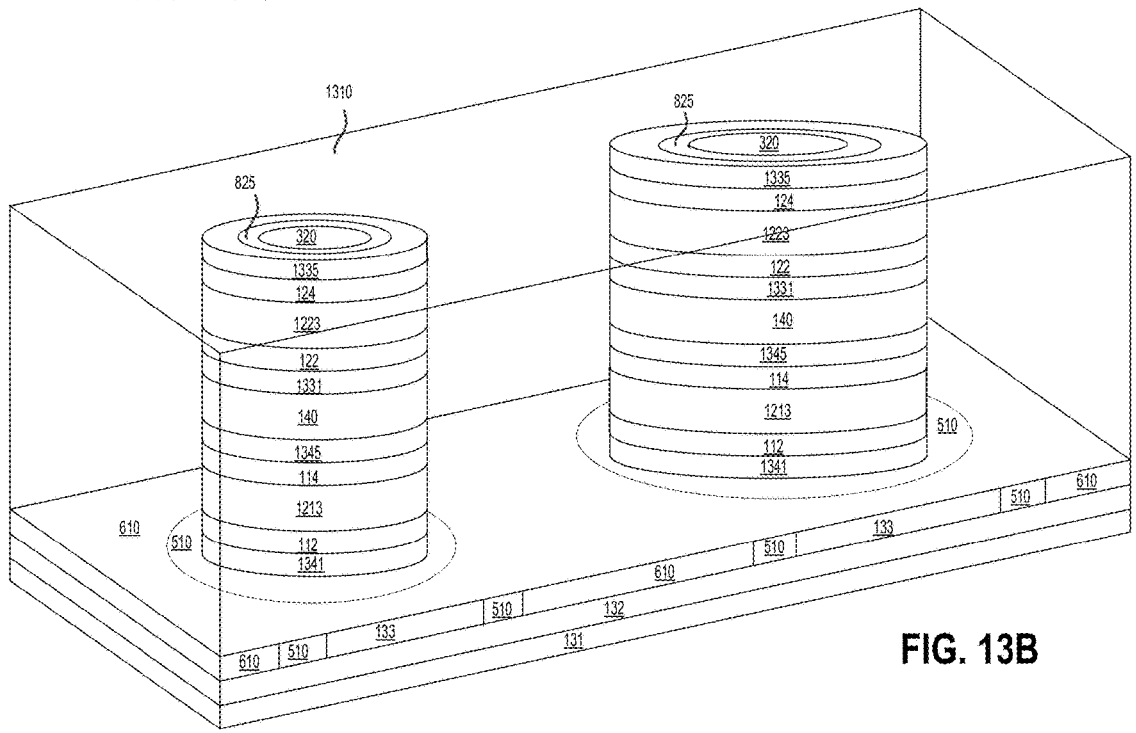
FIG. 13B shows a schematic view of the 3D semiconductor apparatus of FIG. 13A.

As shown in FIG. 13A, the hardmask 150 and the capping dielectric layers 931, 935, 1031 and 1035 can be removed, and salicide metal can be deposited, and then annealed and silicidized with the first S/D material in the S/D regions 1011 and 1015 and the second S/D materials in the S/D regions 821 and 825 to form silicidized salicide metal 1341, 1345, 1331 and 1335, respectively. For example, the salicide metal can be Ruthenium (Ru), Cobalt (Co), Titanium (Ti), Tungsten (W), Palladium (Pd), Platinum (Pt) or Nickel (Ni). In an embodiment, unreacted salicide metal can be removed, a selective nitride cap can be deposited thereon, and an oxide 1310 can be deposited and polished to remove all capping dielectric layers. FIG. 13B shows a schematic view of the 3D semiconductor apparatus of FIG. 13B. In an embodiment, the second channel 320, the upper S/D region 825, the silicidized silicide metal 1335, the dielectric material 510 and the semiconductor apparatus can have circular cross sections. In another embodiment, at least one of the second channel 320, the upper S/D region 825, the silicidized silicide metal 1335, the dielectric material 510 and the semiconductor apparatus can have a rectangular cross section.

Figure 14:
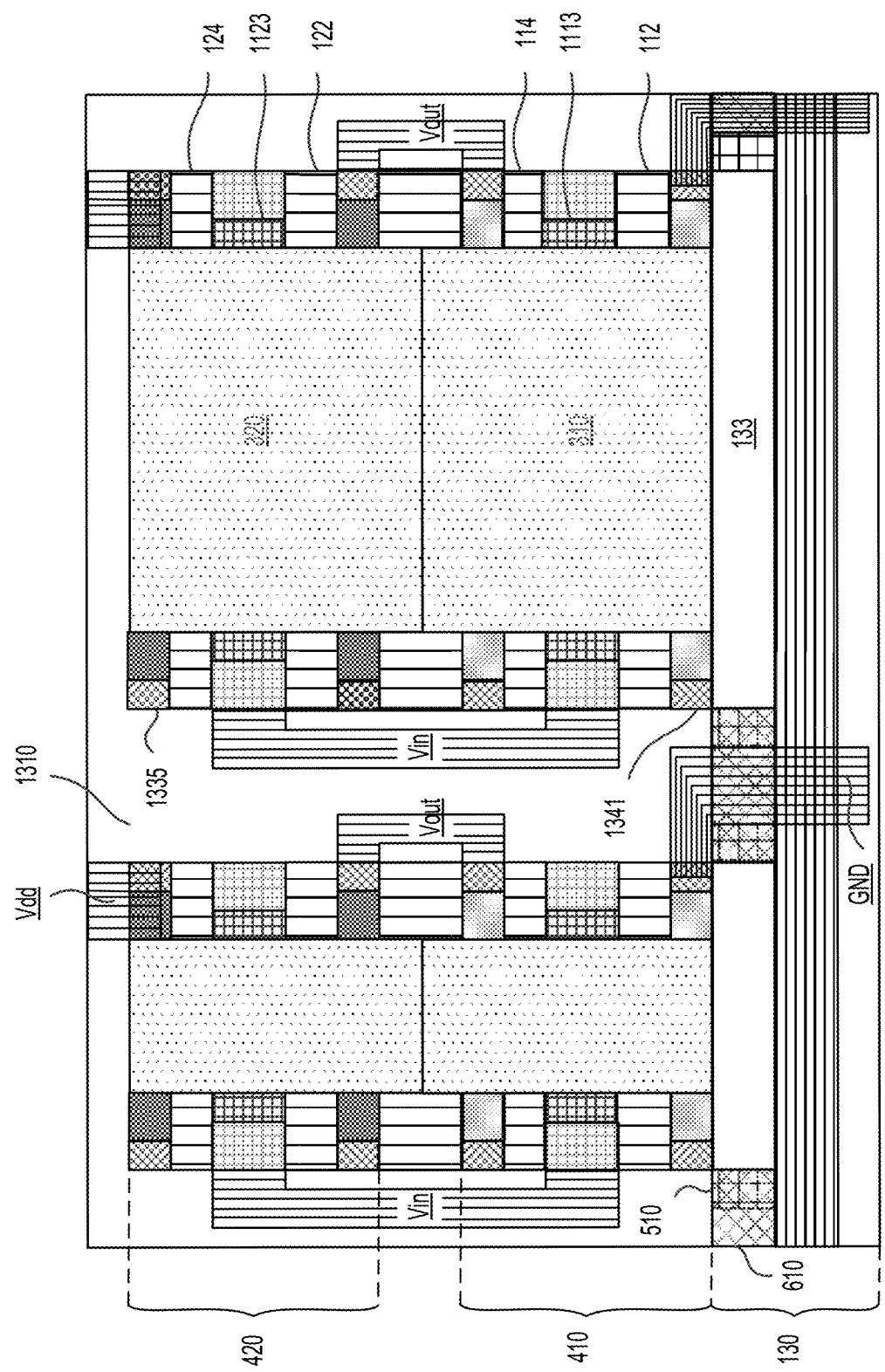

As shown in FIG. 14, Vdd metal can be formed and coupled to the upper S/D region 825 of the second semiconductor device 420, GND metal can be formed to couple the lower S/D region 1011 of the first semiconductor device 410 to the substrate 130, Vin metal can be formed to couple the first metal region 1213 of the first gate region 1113 of the first semiconductor device 410 and the second metal region 1223 of the second gate region 1123 of the second semiconductor device 420, and Vout metal can be formed to couple the silicidized salicide metal 1331 of the lower S/D region 821 of the second semiconductor device 420 to the silicidized salicide metal 1345 of the upper S/D region 1015 of the first semiconductor device 410.

In an embodiment, the transition dielectric layer 140 can include a fourth dielectric material that is capable of being etched selectively with respect to the S/D dielectric layers 111, 115, 121 and 125, which include the first dielectric material, the gate dielectric layers 113 and 123, which include the second dielectric material, and the separation dielectric layers 112, 114, 122 and 124, which include the third dielectric material.

FIGS. 15-29 show cross-sectional views illustrating another exemplary method for fabricating a 3D semiconductor apparatus according to some embodiments of the present disclosure. In an embodiment, the 3D semiconductor apparatus can include a first semiconductor device and a second semiconductor device. FIGS. 15-29 follow a similar flow to FIGS. 1-14, except that the fourth dielectric material is used to form a transition dielectric layer 1540 to assist with isolating the first channel 310 and the second channel 320.

FIGS. 15-19 are similar to FIGS. 1-5, except that the transition dielectric layer 140 in FIGS. 1-5 is replaced with the transition dielectric layer 1540 in FIGS. 15-19.

Figure 20:
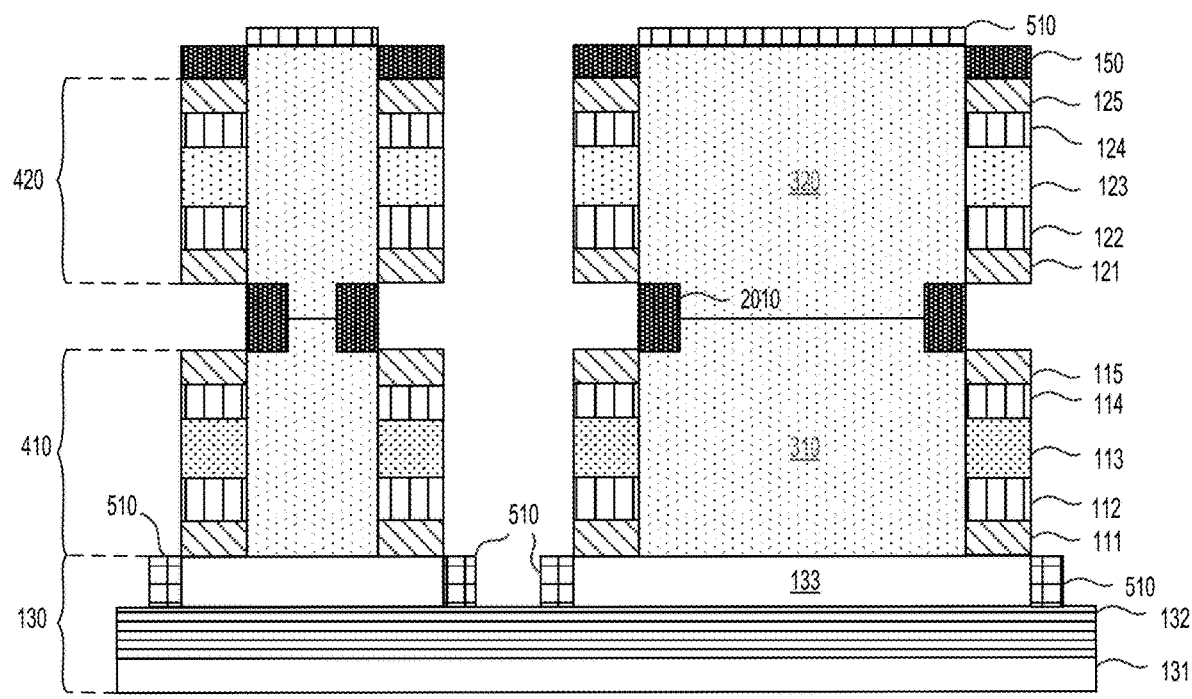

As shown in FIG. 20, the transition dielectric layer 1540 can be removed, and the portion of the first channel 310 and the second channel 320 that interface at the transition dielectric layer 1540 can be oxidized to form an isolation region 2010 to isolate the first channel 310 and the second channel 320.

Figure 21:
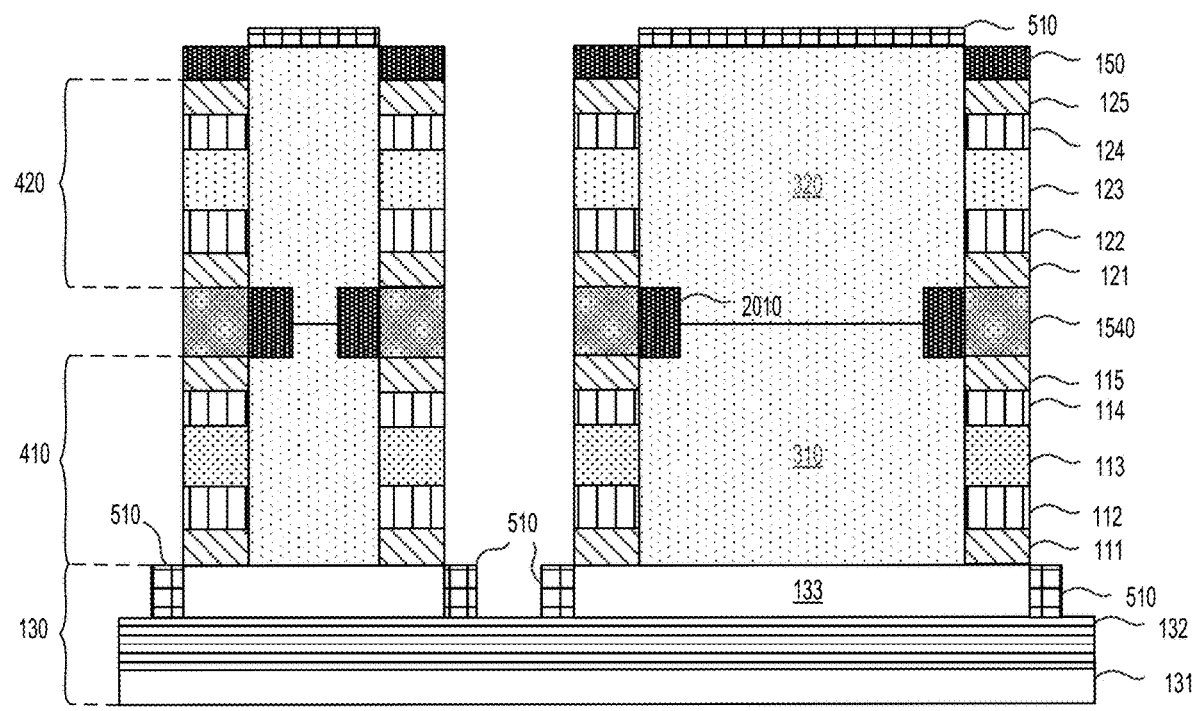

As shown in FIG. 21, the fourth dielectric material can be deposited to form the transition dielectric layer 1540 again. In an embodiment, a fifth dielectric material different from the fourth dielectric material can be deposited to form the transition dielectric layer 1540.

FIGS. 22-29 are similar to FIGS. 6-13, except that the transition dielectric 140 in FIGS. 6-13 is replaced with the transition dielectric layer 1540 in FIGS. 22-29 and the isolation region 2010 is further formed between the first channel 310 and the second channel 320 at the transition dielectric layer 1540 in FIGS. 22-29.

The method shown in FIGS. 1-14 and the method shown in FIGS. 15-29 can be combined to form the first semiconductor device 410 and the second semiconductor device 420. For example, the first semiconductor device 410 and the second semiconductor device 420 at the right hand side of FIGS. 15-29 can be replaced by the first semiconductor device 410 and the second semiconductor device 420 at the right hand side of FIGS. 1-14. In such an scenario, a photoresist mask can enable the transition dielectric layer 1540 of the first dielectric layer stack 110 and the second dielectric layer stack 120 at the left hand side of FIGS. 15-29 to be removed and the isolation region 2010 to be formed between the first channel 310 and the second channel 320 at the transition dielectric layer 1540. The methods in FIGS. 1-14 and FIGS. 15-29 combined can allow for maximum 3D layout with reduced circuit connections for different logic blocks in different regions of the wafer.

Figure 29:
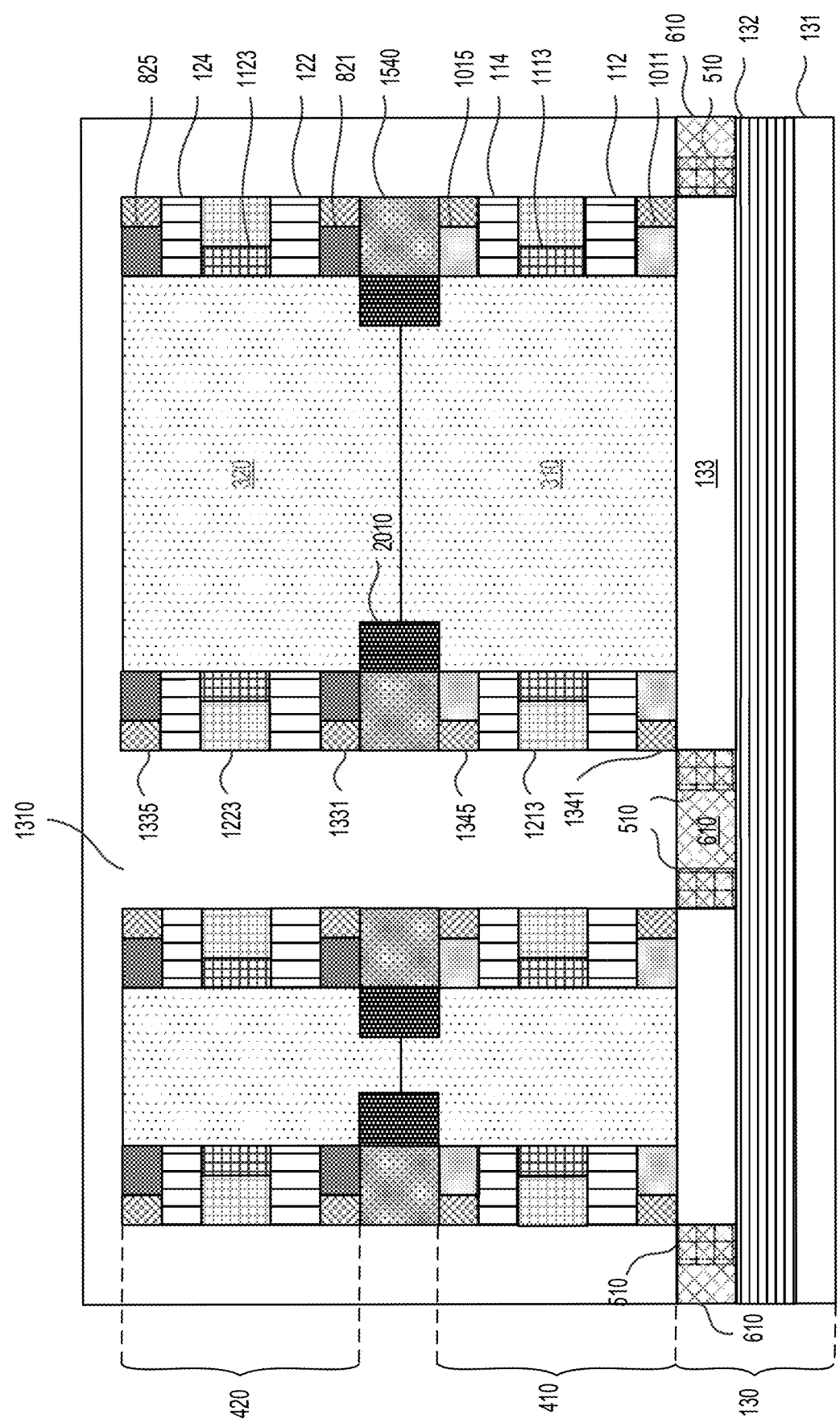
Figure 30:
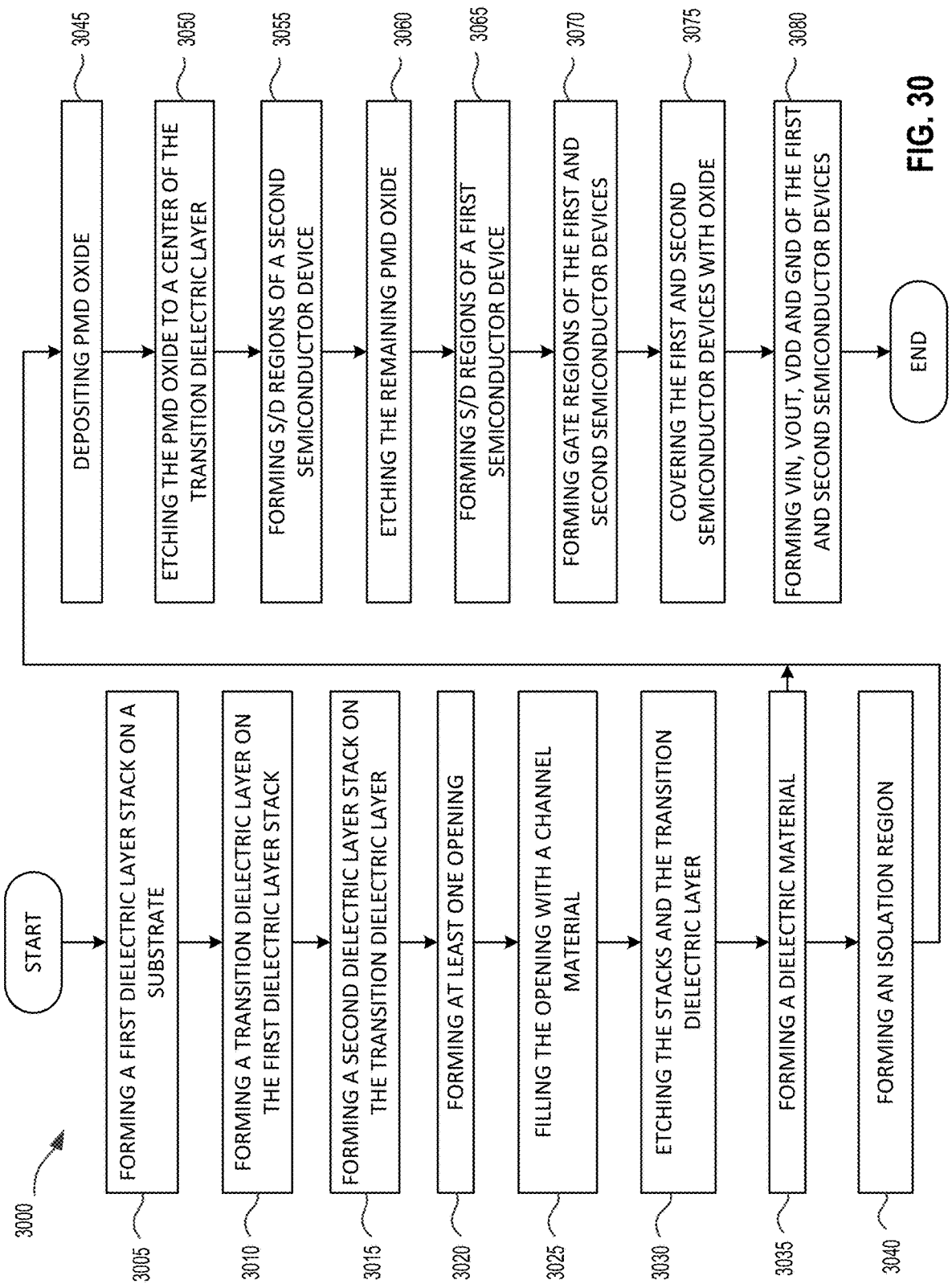
FIG. 30 shows a flow chart of an exemplary method for fabricating a 3D semiconductor apparatus according to some embodiments of the present disclosure.

FIG. 30 shows a flow chart of an exemplary method 3000 for fabricating a 3D semiconductor apparatus according to some embodiments of the present disclosure. For example, the 3D semiconductor apparatus can include a first semiconductor device and a second semiconductor device. In an embodiment, some of the steps of the method 3000 shown can be performed concurrently or in a different order than shown, can be substituted by other method steps, or can be omitted. Additional method steps can also be performed as desired. In another embodiment, the method 3000 can correspond to the method shown in FIGS. 1-14 and the method shown in FIGS. 15-29.

Figure 15:
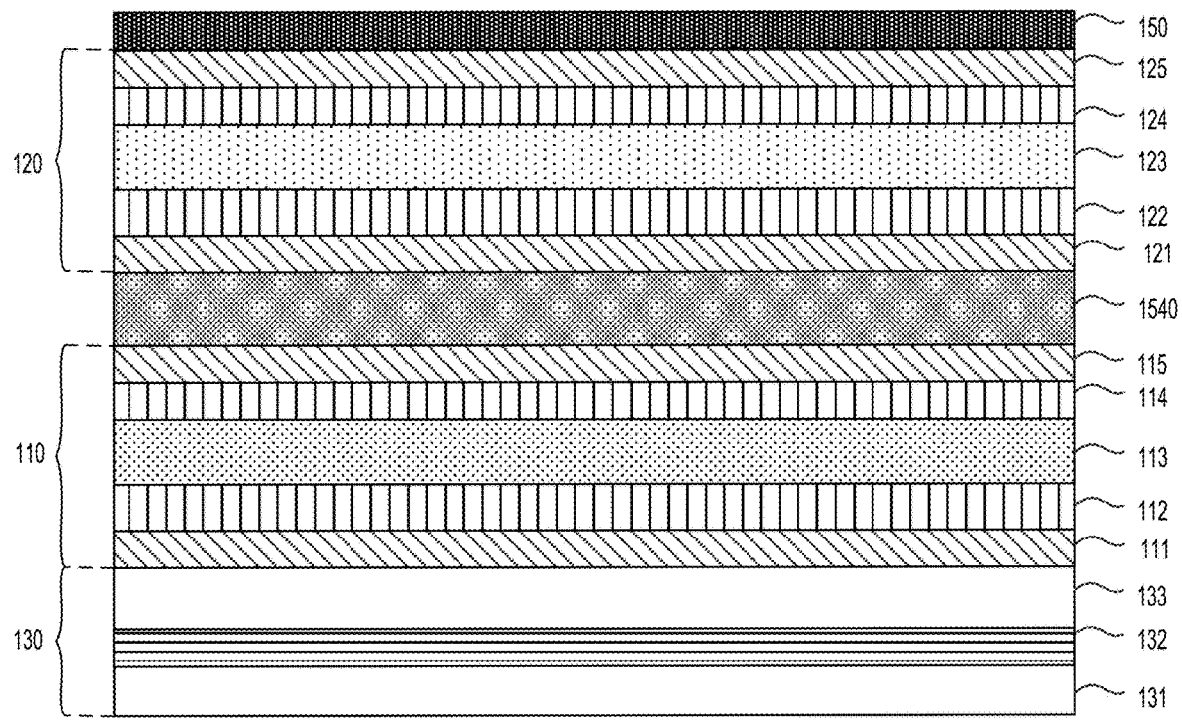
FIGS. 15-29 show cross-sectional views illustrating another exemplary method for fabricating a 3D semiconductor apparatus according to some embodiments of the present disclosure.

At step 3005, a first dielectric layer stack can be formed on a substrate. In an embodiment, the first dielectric layer stack can be the first dielectric layer stack 110, and the substrate can be the substrate 130, as shown in FIGS. 1 and 15.

At step 3010, a transition dielectric layer can be formed on the first dielectric layer stack. In an embodiment, the transition dielectric layer can be the transition dielectric layer 140, as shown in FIG. 1. In another embodiment, the transition dielectric layer can be the transition dielectric layer 1540, as shown in FIG. 15.

At step 3015, a second dielectric layer stack can be formed on the transition dielectric layer. In an embodiment, the second dielectric layer stack can be the second dielectric layer stack 120, as shown in FIGS. 1 and 15.

Figure 16:
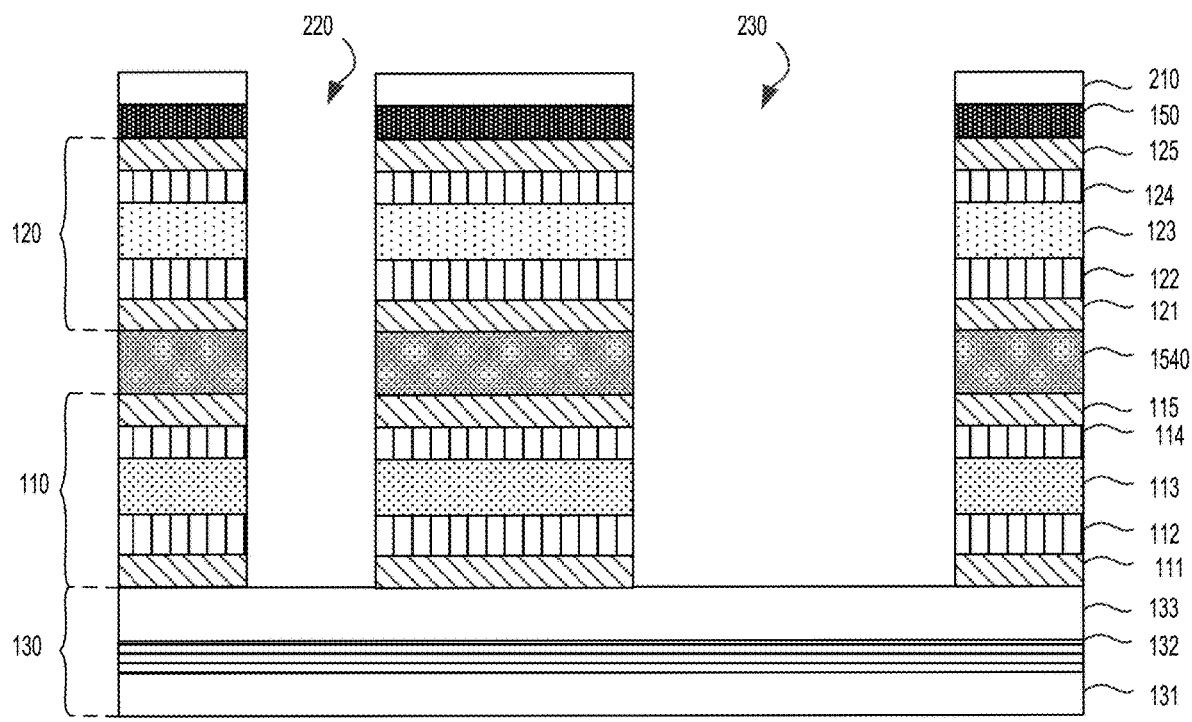

At step 3020, at least one opening through the second dielectric layer stack, the transition dielectric layer and the first dielectric layer stack down to the substrate 130 can be formed. In an embodiment, the at least one opening can include the openings 220 and 230, as shown in FIGS. 2 and 16.

Figure 17:
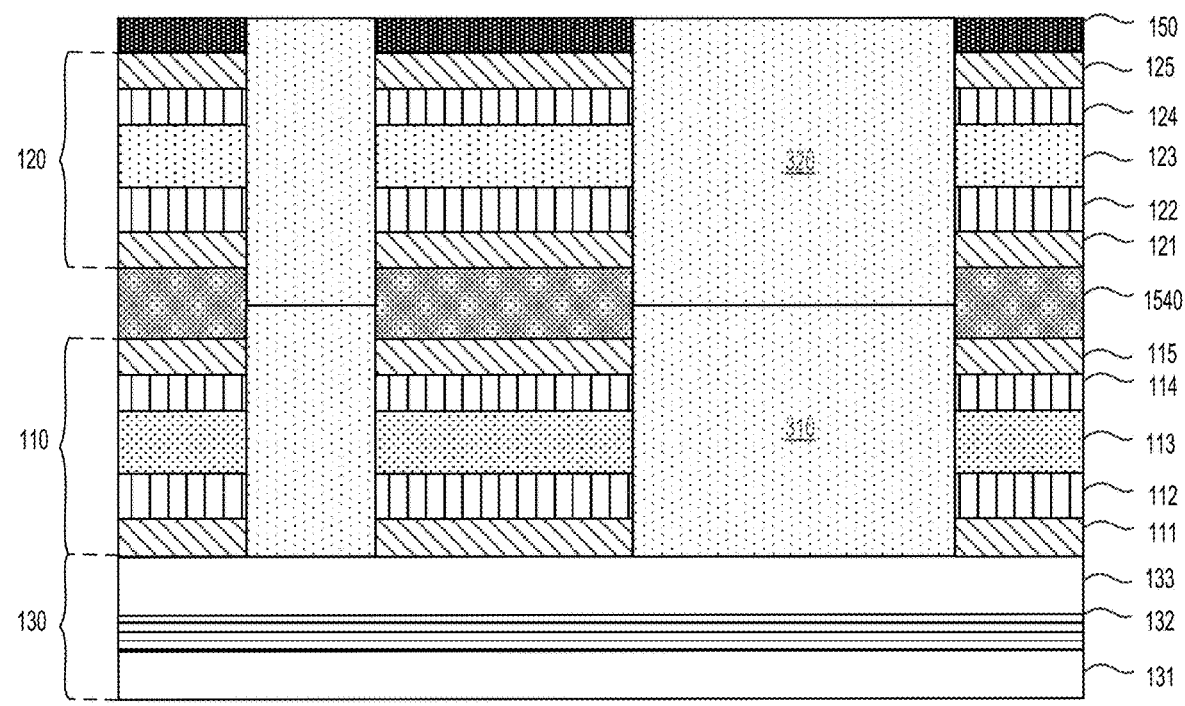

At step 3025, the opening can be filled with a channel material. In an embodiment, the channel material can include a first channel material and a second channel material. For example, the first channel material can be epitaxially grown from the substrate 130 to the transition dielectric layer 140/1540, and a first type of dopants can be doped into the first channel material to form the first channel 310, as shown in FIGS. 3 and 17. As another example, the second channel material can be epitaxially grown from the transition dielectric layer 140/1540 to the top of the second dielectric layer stack 120, and a second type of dopants can be doped into the second channel material to form the second channel 320, as shown in FIGS. 3 and 17.

Figure 18:
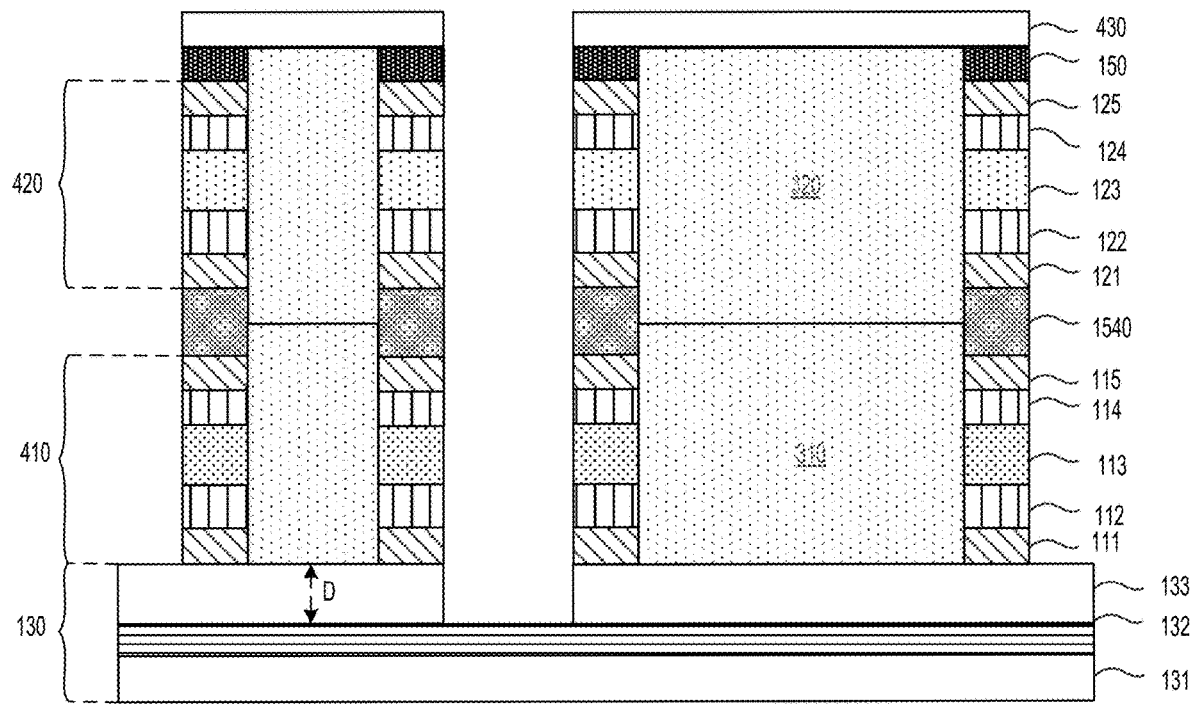

At step 3030, the second dielectric layer stack 120, the transition dielectric layer 140 and the first dielectric layer stack 110 can be etched, as shown in FIGS. 4 and 18.

Figure 19:
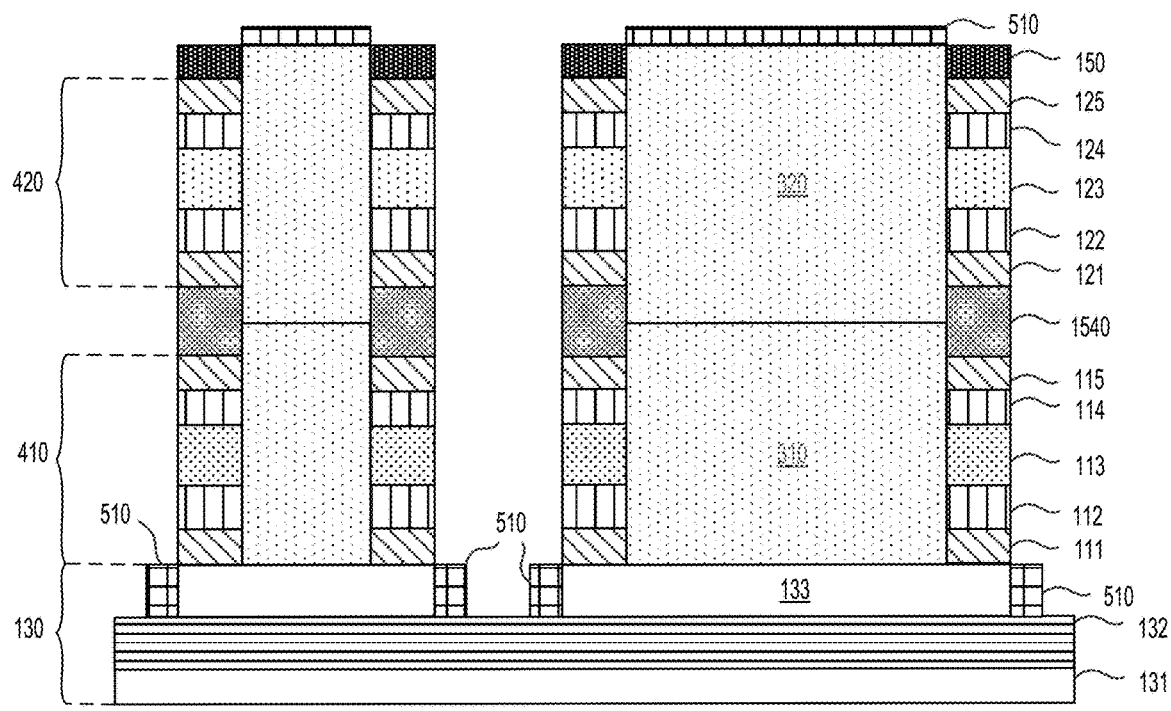

At step 3035, a dielectric material can be optionally deposited or grown on the second channel 320 and the substrate 130. In an embodiment, the dielectric material can be the dielectric material 510, as shown in FIGS. 5 and 19.

At step 3040, the transition dielectric layer that is the transition dielectric layer 1540 can be removed, the isolation region 2010 can be formed, and the transition dielectric layer 1540 can be formed again, as shown in FIGS. 20 and 21.

Figure 22:
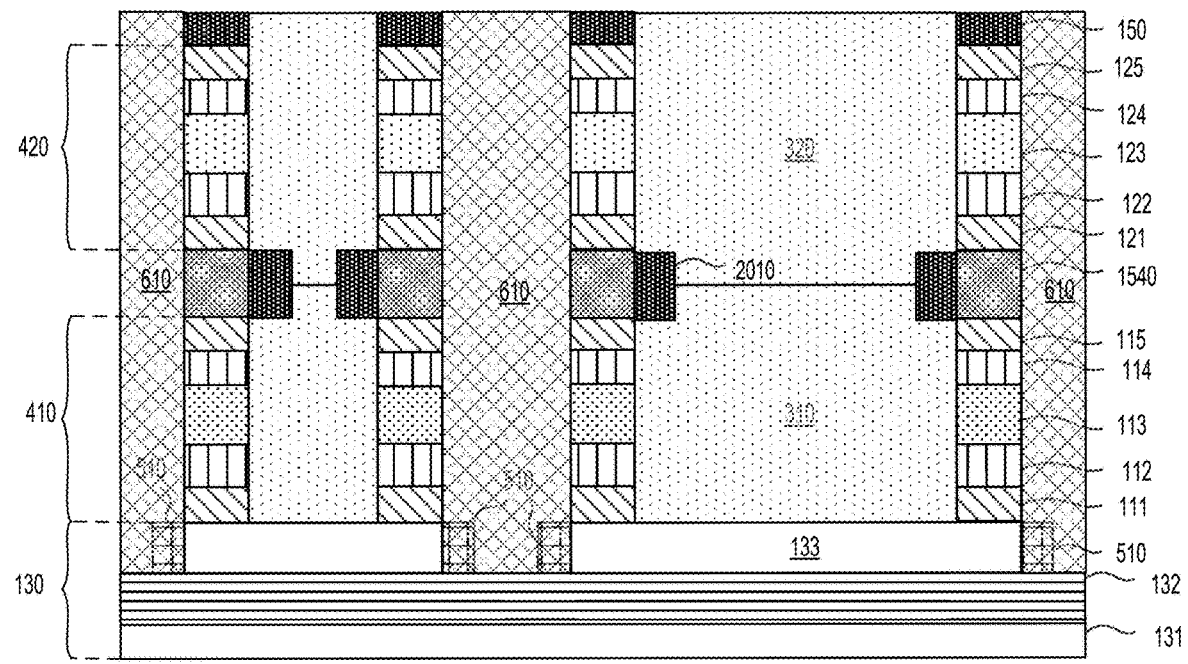

At step 3045, PMD oxide can be deposited. In an embodiment, the PMD oxide can be the PMD oxide 610, as shown in FIGS. 6 and 22.

Figure 23:
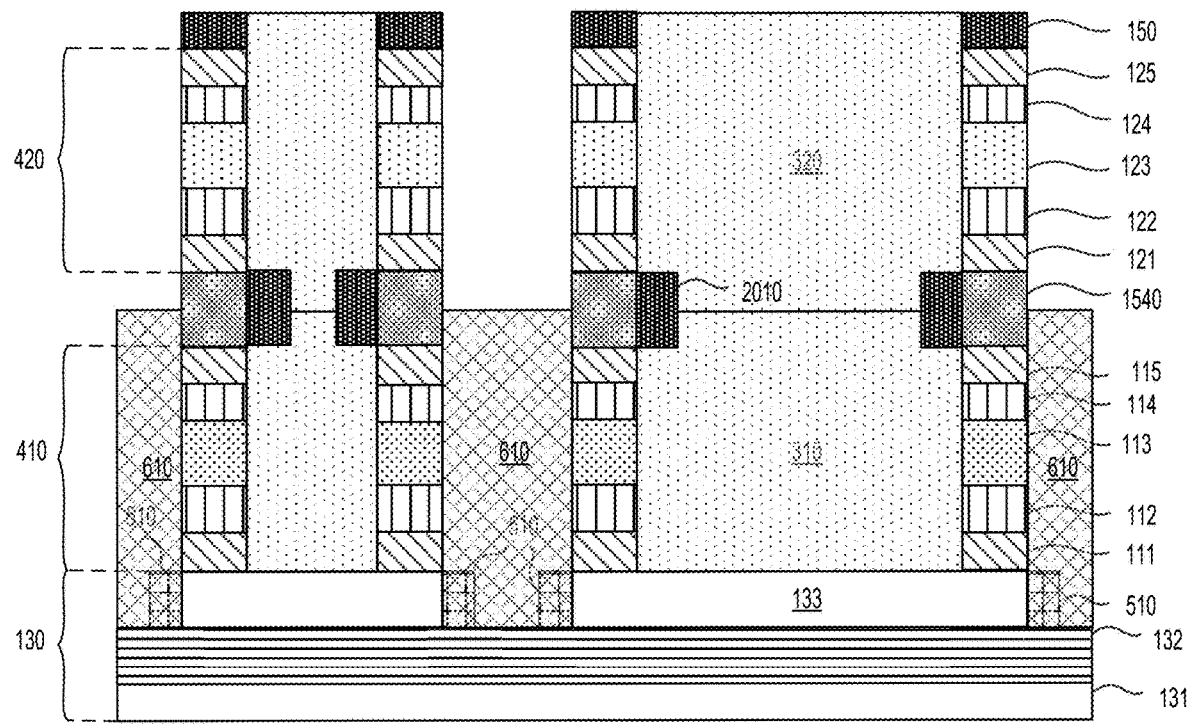
Figure 24:
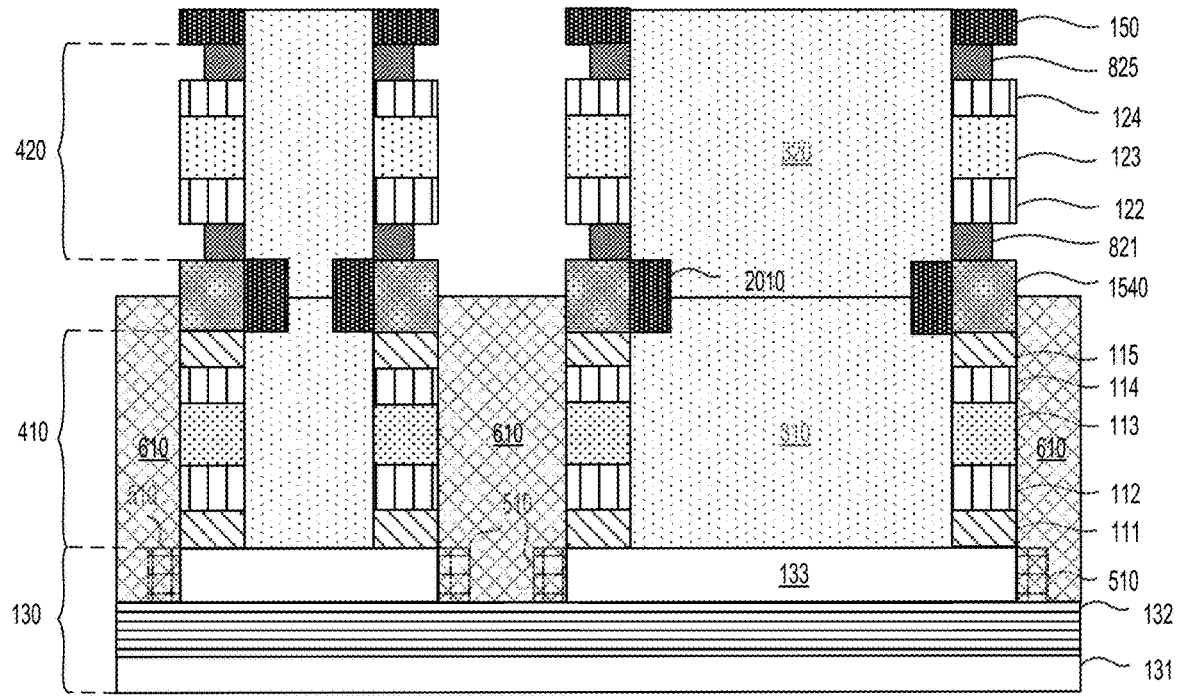
Figure 25:
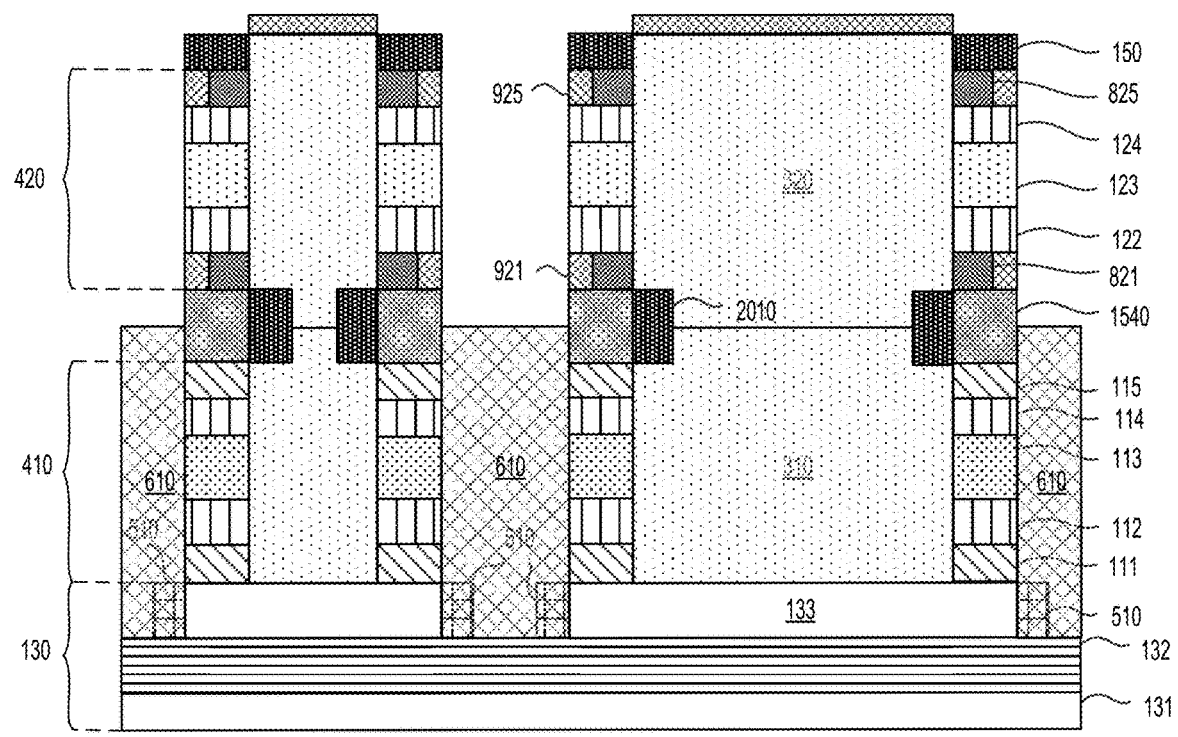

At step 3050, the PMD oxide can be etched to a center of the transition dielectric layer. In an embodiment, the PMD oxide 610 can be etched to a center of the transition dielectric layer 140/1540, as shown in FIGS. 7 and 23.

At step 3055, S/D regions of a second semiconductor device can be formed. In an embodiment, the S/D regions of the second semiconductor device can be the S/D regions 821 and 825 of the second semiconductor device 420, as shown in FIGS. 8, 9, 24 and 25.

Figure 26:
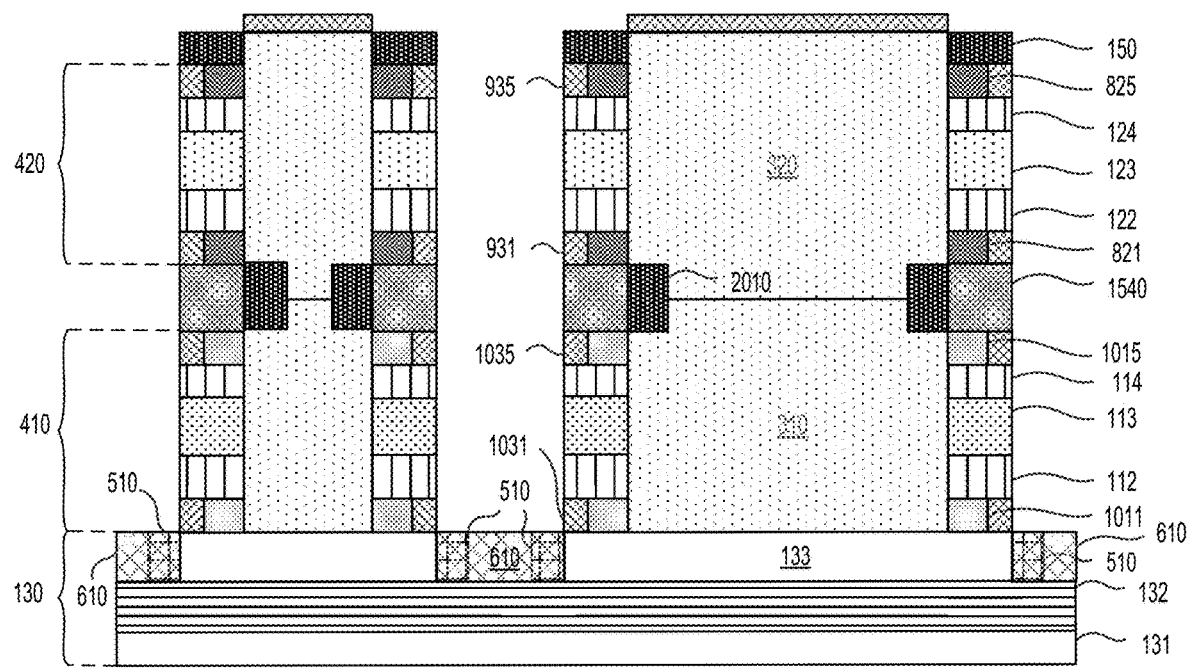
Figure 27:
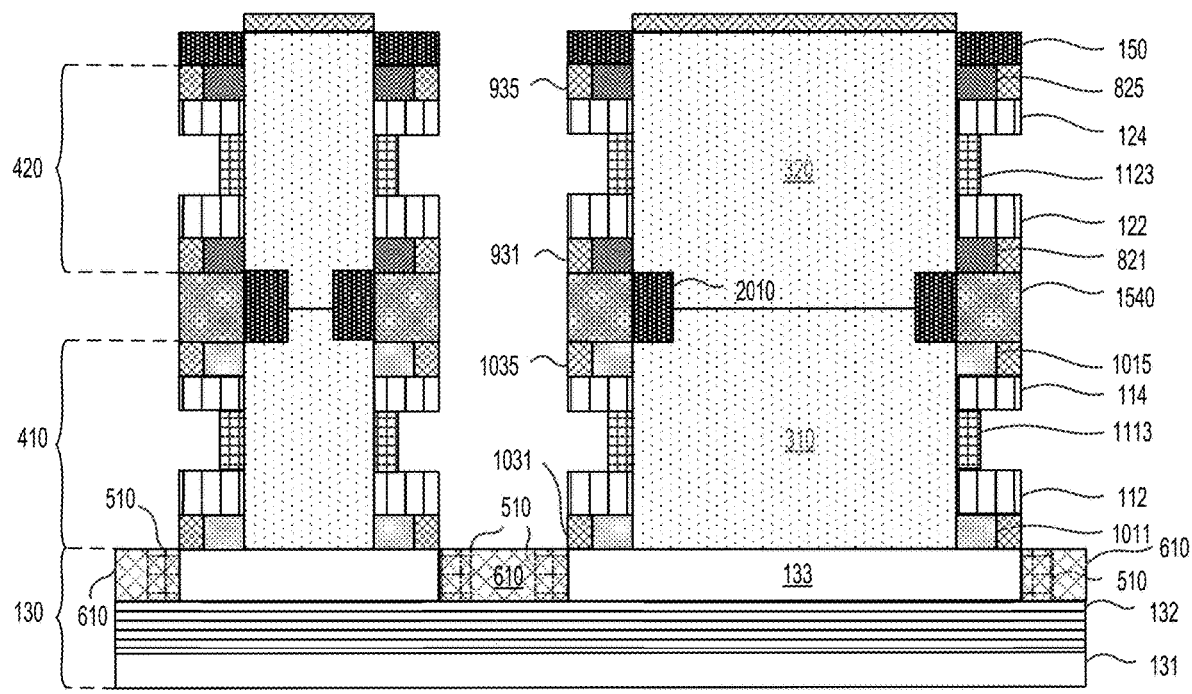
Figure 28:
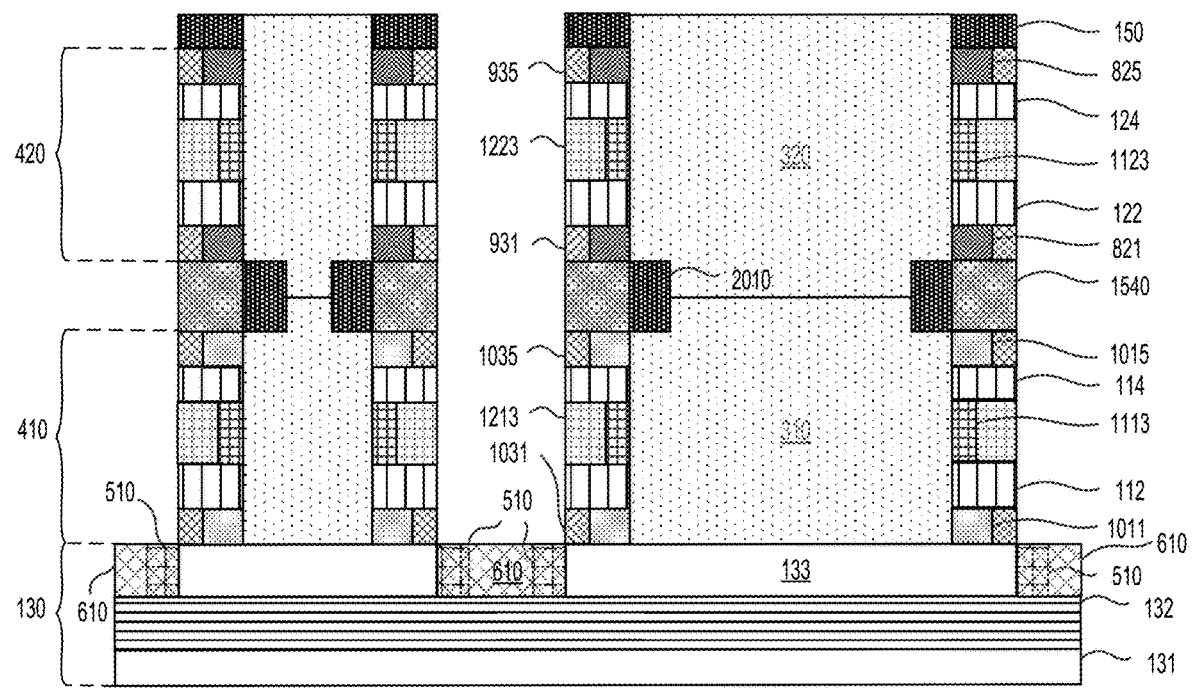

At step 3060, the remaining PMD oxide can be etched, as shown in FIGS. 10 and 26.

At step 3065, S/D regions of a first semiconductor device can be formed. In an embodiment, the S/D regions of the first semiconductor device can be the S/D regions 1011 and 1015 of the first semiconductor device 410, as shown in FIGS. 10 and 26.

At step 3070, gate regions of the first and second semiconductor devices can be formed. In an embodiment, the gate regions of the first and second semiconductor devices can be the first gate region 1113 of the first semiconductor device 410 and the second gate region 1123 of the second semiconductor device 420, as shown in FIGS. 11, 12, 27 and 28.

At step 3075, the first and second semiconductor devices can be covered with oxide. In an embodiment, the oxide can be the oxide 1310, as shown in FIGS. 13 and 29.

At step 3080, Vin, Vout, Vdd and GND can be formed. In an embodiment, Vin can couple the first gate region 1113 of the first semiconductor device 410 to the second gate region 1123 of the second semiconductor device 420, Vout can couple the lower S/D region 821 of the second semiconductor device 420 to the upper S/D region 1015 of the first semiconductor device 410, Vdd can be coupled to the upper S/D region 825 of the second semiconductor device 420, and GND can couple the lower S/D region 1011 of the first semiconductor device 410 to the substrate 130, as shown in FIG. 14.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating a semiconductor apparatus, comprising:
forming a multilayer stack on a substrate, the multilayer stack including gate dielectric layers, a transition dielectric layer that is capable of being etched selectively with respect to the gate dielectric layers, and first and second source/drain (S/D) dielectric layers that are capable of being etched selectively with respect to the gate dielectric layers and the transition dielectric layer;
forming at least one opening through the multilayer stack to the substrate such that the substrate is uncovered;
forming in the opening a first channel of a first semiconductor device of the semiconductor apparatus vertically from the uncovered substrate and a second channel of a second semiconductor device of the semiconductor apparatus vertically from the first channel, the first channel interfacing with the second channel at the transition dielectric layer of the multilayer stack;
etching the second S/D dielectric layers of the multilayer stack and replacing with a second S/D material to form second S/D regions of the second semiconductor device of the semiconductor apparatus;
etching the first S/D dielectric layers of the multilayer stack and replacing with a first S/D material to form first S/D regions of the first semiconductor device of the semiconductor apparatus; and
etching the gate dielectric layers of the multilayer stack and replacing with a gate material to form a first gate region of the first semiconductor device of the semiconductor apparatus and a second gate region of the second semiconductor device of the semiconductor apparatus.

2. The method of claim 1, wherein the first and second semiconductor devices are of different types.

3. The method of claim 1, wherein the multilayer stack further includes separation dielectric layers that separate the gate dielectric layers from the S/D dielectric layers and are capable of being etched selectively with respect to the gate dielectric layers and the S/D dielectric layers.

4. The method of claim 1, further comprising:
etching the transition dielectric layer to uncover a portion of the first channel and the second channel that interface at the transition dielectric layer;
oxidizing the uncovered portion of the first channel and the second channel to form an isolation region; and
covering the isolation portion with a dielectric material that is capable of being etched selectively with respect to the gate dielectric layers and the first and second S/D dielectric layers.

5. The method of claim 4, wherein the transition dielectric layer includes a same dielectric material as the dielectric material.

6. The method of claim 1, wherein the gate material includes a dielectric material and a metal material.

7. The method of claim 6, further comprising:
coupling the metal material of the first gate region of the first semiconductor device to the metal material of the second gate region of the second semiconductor device.

8. The method of claim 1, wherein forming at least one opening includes:
forming two openings through the multilayer stack to the substrate such that the substrate is exposed.

9. The method of claim 8, wherein the two openings have different sizes.

10. The method of claim 8, further comprising:
etching the multilayer stack to define sidewall structures of the multilayer stack that are around the first and second channels,
wherein etching the second S/D dielectric layers of the multilayer stack includes etching second S/D dielectric layers of the sidewall structures of the multilayer stack,
etching the first S/D dielectric layers of the multilayer stack includes etching first S/D dielectric layers of the sidewall structures of the multilayer stack, and
etching the gate dielectric layers of the multilayer stack includes etching gate dielectric layers of the sidewall structures of the multilayer stack.

11. The method of claim 1, further comprising:
forming a pre-metal dielectric (PMD) oxide to cover the first semiconductor device before the gate regions and the first and second S/D regions are formed; and
removing the PDM oxide to uncover the first dielectric layer stack after the second S/D regions are formed.

12. The method of claim 11, wherein etching the second S/D dielectric layers of the multilayer stack and replacing with a second material includes:
etching the second S/D dielectric layers;
forming the second S/D material; and
forming a second capping dielectric layer to protect the second S/D material.

13. The method of claim 12, wherein etching the first S/D dielectric layers of the multilayer stack and replacing with a first material includes:
etching the first S/D dielectric layers;
forming the first S/D material; and
forming a first capping dielectric layer to protect the first S/D material,
wherein the first S/D material is of a different type from the second S/D material.

14. The method of claim 13, further comprising:
removing the first and second capping dielectric layers;
depositing salicide metal on the first and second S/D materials; and
silicidizing the salicide metal with the first and second S/D materials.

15. The method of claim 14, wherein the salicide metal is selected from the group consisting of Ruthenium (Ru), Cobalt (Co), Titanium (Ti), Tungsten (W), Palladium (Pd), Platinum (Pt) and Nickel (Ni).

16. The method of claim 14, further comprising:
coupling the silicidized salicide metal of a lower one of the second S/D regions of the second semiconductor device to the silicidized salicide metal of an upper one of the first S/D regions of the first semiconductor device.

17. The method of claim 1, wherein the substrate is a semiconductor substrate.

18. The method of claim 17, wherein the first and second channels are formed by:
   epitaxially growing, within the opening, a first channel material from the substrate to the transition dielectric layer to form the first channel; and
   epitaxially growing, within the opening, a second channel material from the transition dielectric layer to top of the multilayer stack to form the second channel.

19. The method of claim 18, wherein epitaxially growing the first channel material includes epitaxially growing an intrinsic channel material and doping a first type of dopants into the intrinsic channel material, and epitaxially growing the second channel material includes epitaxially growing the intrinsic channel material and doping a second type of dopants into the intrinsic channel material.

20. The method of claim 1, wherein the first S/D dielectric layers are capable of being etched selectively with respect to the second S/D dielectric layers.

* * * * *

UNITED STATES PATENT AND TRADEMARK OFFICE
CERTIFICATE OF CORRECTION

PATENT NO. : 11,302,587 B2
APPLICATION NO. : 16/951125
DATED : April 12, 2022
INVENTOR(S) : Gardner et al.

It is certified that error appears in the above-identified patent and that said Letters Patent is hereby corrected as shown below:

On the Title Page

Item (54), and in the Specification, Column 1, Line 4, delete "SEMINCONDUCTOR" and insert -- SEMICONDUCTOR --, therefor.

Column 2, Item (57), under "ABSTRACT", Line 10, insert -- of -- before "the multilayer".

Signed and Sealed this
Twenty-fifth Day of October, 2022

Katherine Kelly Vidal
*Director of the United States Patent and Trademark Office*